(12) United States Patent
Fujiwara et al.

(10) Patent No.: US 10,679,922 B2
(45) Date of Patent: Jun. 9, 2020

(54) COMPOSITION FOR HEAT-DISSIPATING MEMBER, HEAT-DISSIPATING MEMBER, ELECTRONIC INSTRUMENT, METHOD FOR PRODUCING COMPOSITION FOR HEAT-DISSIPATING MEMBER, AND METHOD FOR PRODUCING HEAT-DISSIPATING MEMBER

(71) Applicants: JNC CORPORATION, Tokyo (JP); OSAKA RESEARCH INSTITUTE OF INDUSTRIAL SCIENCE AND TECHNOLOGY, Osaka (JP)

(72) Inventors: Takeshi Fujiwara, Chiba (JP); Jyunichi Inagaki, Chiba (JP); Masako Hinatsu, Chiba (JP); Yasuyuki Agari, Osaka (JP); Hiroshi Hirano, Osaka (JP); Joji Kadota, Osaka (JP); Akinori Okada, Osaka (JP)

(73) Assignees: JNC CORPORATION, Tokyo (JP); OSAKA RESEARCH INSTITUTE OF INDUSTRIAL SCIENCE AND TECHNOLOGY, Osaka (JP)

( * ) Notice: Subject to any disclaimer, the term of this patent is extended or adjusted under 35 U.S.C. 154(b) by 61 days.

(21) Appl. No.: 16/081,426

(22) PCT Filed: Feb. 28, 2017

(86) PCT No.: PCT/JP2017/008028
§ 371 (c)(1),
(2) Date: Aug. 31, 2018

(87) PCT Pub. No.: WO2017/150588
PCT Pub. Date: Sep. 8, 2017

(65) Prior Publication Data
US 2019/0023900 A1    Jan. 24, 2019

(30) Foreign Application Priority Data
Mar. 2, 2016 (JP) ................................ 2016-040524

(51) Int. Cl.
| | |
|---|---|
| *H01L 23/373* | (2006.01) |
| *C09C 3/12* | (2006.01) |
| *C09K 5/14* | (2006.01) |
| *H01L 23/36* | (2006.01) |
| *C08K 9/06* | (2006.01) |
| *C08K 3/28* | (2006.01) |

(52) U.S. Cl.
CPC .............. *H01L 23/373* (2013.01); *C08K 9/06* (2013.01); *C09C 3/12* (2013.01); *C09K 5/14* (2013.01); *H01L 23/36* (2013.01); *H01L 23/3737* (2013.01); *C08K 2003/285* (2013.01); *C08K 2201/014* (2013.01); *C08L 2312/08* (2013.01); *H01L 23/3731* (2013.01); *H01L 23/3732* (2013.01)

(58) Field of Classification Search
CPC ..................................... C09C 3/12; C09K 9/06
See application file for complete search history.

(56) References Cited

U.S. PATENT DOCUMENTS

2017/0306207 A1* 10/2017 Fujiwara ............... C09K 5/14
2018/0208793 A1*  7/2018 Kim ....................... C09D 7/40

FOREIGN PATENT DOCUMENTS

| JP | 2006265527 | 10/2006 |
|---|---|---|
| JP | 2010116543 | 5/2010 |
| JP | 2012153846 | 8/2012 |
| WO | 2015170744 | 11/2015 |
| WO | 2016031888 | 3/2016 |
| WO | WO 2016/031888 | * 3/2016 |

OTHER PUBLICATIONS

"International Search Report (Form PCT/ISA/210)" of PCT/JP2017/008028, dated Apr. 4, 2017, with English translation thereof, pp. 1-4.
"Search Report of Europe Counterpart Application", dated Jul. 9, 2019, pp. 1-6.

* cited by examiner

*Primary Examiner* — Marc S Zimmer
(74) *Attorney, Agent, or Firm* — JCIPRNET

(57) ABSTRACT

The inventions are: a composition capable of forming a heat-dissipating member that has high thermal conductivity and in which the thermal expansion coefficient can be controlled; and a heat-dissipating member. This composition for a heat-dissipating member comprises a thermally conductive first inorganic filler bonded to one end of a first coupling agent, and a thermally conductive second inorganic filler bonded to one end of a second coupling agent, the composition being characterized in that: at least one of the first coupling agent and the second coupling agent is a liquid crystal silane coupling agent; the other end of the first coupling agent and the other end of the second coupling agent each have a functional group bondable with one another; and the other end of the first coupling agent bonds with the other end of the second coupling agent by a curing treatment.

20 Claims, 6 Drawing Sheets

COMPOSITION FOR HEAT-DISSIPATING MEMBER, HEAT-DISSIPATING MEMBER, ELECTRONIC INSTRUMENT, METHOD FOR PRODUCING COMPOSITION FOR HEAT-DISSIPATING MEMBER, AND METHOD FOR PRODUCING HEAT-DISSIPATING MEMBER

CROSS-REFERENCE TO RELATED APPLICATION

This application is a 371 of international application of PCT application serial no. PCT/JP2017/008028, filed on Feb. 28, 2017, which claims the priority benefit of Japan application no. 2016-040524, filed on Mar. 2, 2016. The entirety of each of the abovementioned patent applications is hereby incorporated by reference herein and made a part of this specification.

TECHNICAL FIELD

The present invention relates to a composition for a heat-dissipating member, and particularly, to a composition for a heat-dissipating member that can form a heat-dissipating member having a heat resistance through which heat generated in an electronic instrument is efficiently conducted and transferred and thus is dissipated, and which can control a thermal expansion coefficient.

BACKGROUND ART

In recent years, in semiconductor devices for controlling the power of hybrid vehicles and electric vehicles, and CPUs for high-speed computers, it has been desired to increase the thermal conductivity of a packaging material in order to prevent a temperature of an internal semiconductor from being too high. That is, an ability to effectively discharge heat generated from a semiconductor chip to the outside is important. In addition, due to a rise in the operation temperature, thermal distortion may occur due to a difference between thermal expansion coefficients of materials used in a package, and there is also a problem of a reduced lifespan due to peeling off of a wiring or the like.

As a method of solving such a heat dissipation problem, there is a method in which a highly heat conductive material (heat-dissipating member) is brought into contact with a heat generating part and heat is conducted to the outside, and heat dissipation is performed. Examples of a highly heat conductive material include inorganic materials such as a metal and a metal oxide. In particular, aluminum nitride is preferably used because it has a thermal expansion coefficient close to that of silicon. However, such inorganic materials have problems in terms of processability and being easily cracked, and it cannot be said that they have characteristics sufficient for a substrate material in a package. Therefore, development of a heat-dissipating member having high thermal conductivity by combining such inorganic materials and resins is underway.

In order to increase the thermal conductivity of a resin composite material, generally, a large amount of a metal filling material or an inorganic filling material is added to a general purpose resin such as a silicone resin, a polyamide resin, a polystyrene resin, an acrylic resin, and an epoxy resin. However, the thermal conductivity of an inorganic filling material has a value unique to that substance and has an upper limit that is fixed. Therefore, many methods of improving the thermal conductivity of a resin and increasing the thermal conductivity of a composite material are being attempted.

In Patent Literature 1, as a method of improving the thermal conductivity of a resin, a heat-dissipating member obtained by performing alignment control and polymerization of a liquid crystal composition using an alignment control additive or rubbing treatment method is disclosed.

CITATION LIST

Patent Literature

[Patent Literature 1]
Japanese Unexamined Patent Application Publication No. 2006-265527

SUMMARY OF INVENTION

Technical Problem

As described above, with the development of electronic devices, heat dissipating members are required to have more effective thermal conduction and controllability of a thermal expansion coefficient.

Thus, an objective of the present invention is to provide a composition that can form a heat-dissipating member having high thermal conductivity and a thermal expansion coefficient that can be controlled, and a heat-dissipating member.

Solution to Problem

The inventors found that, in combining an organic material and an inorganic material, when inorganic materials are connected to each other rather than adding an inorganic material to a resin, that is, when inorganic materials are directly bonded to each other using a coupling agent of which a mesogenic site in a framework exhibits liquid crystallinity, it is possible to realize a composite material that has very high thermal conductivity, a thermal expansion coefficient that can be controlled, and also has heat resistance, and thereby completed the present invention.

A composition for a heat-dissipating member of a first aspect of the present invention includes a thermally conductive first inorganic filler that is bonded to one end of a first coupling agent; and a thermally conductive second inorganic filler that is bonded to one end of a second coupling agent, wherein at least one of the first coupling agent and the second coupling agent is a liquid crystal silane coupling agent, wherein the other end of the first coupling agent and the other end of the second coupling agent have functional groups capable of bonding to each other, and wherein the other end of the first coupling agent is bonded to the other end of the second coupling agent through curing treatment. The "liquid crystal silane coupling agent" refers to a coupling agent having a mesogenic site in a framework of a silane coupling agent. The mesogenic site has liquid crystallinity. "One end" and "the other end" may be tips or ends in a shape of a molecule and may or may not be both ends of the long side of a molecule.

In such a configuration, the heat-dissipating member can be formed by directly bonding inorganic fillers using a liquid crystal silane coupling agent. Therefore, it is possible to directly propagate phonons which are a main element for thermal conduction, and the cured heat-dissipating member can have very high thermal conductivity not only in the horizontal direction but also in the thickness direction.

According to a composition for a heat-dissipating member of a second aspect of the present invention, in the composition for a heat-dissipating member according to the first aspect of the present invention, the first inorganic filler and the second inorganic filler are at least one selected from the group consisting of boron nitride, boron carbide, boron carbonitride, graphite, carbon fibers, carbon nanotubes, graphene, alumina, silica, aluminum nitride, silicon carbide, zinc oxide, magnesium hydroxide, and an iron oxide-based material.

In such a configuration, the inorganic filler has high thermal conductivity, and a positive or very small or negative thermal expansion coefficient, and in combination therewith, a desired composition for a heat-dissipating member is obtained.

A composition for a heat-dissipating member of a third aspect of the present invention further includes a thermal conductive third inorganic filler having a different thermal expansion coefficient from those of the first inorganic filler and the second inorganic filler in the composition for a heat-dissipating member according to the first aspect or the second aspect of the present invention.

In such a configuration, when the first inorganic filler and the second inorganic filler have different thermal expansion coefficients, if these are combined, a thermal expansion coefficient of the combined composition for a heat-dissipating member has a value intermediate between those for formulations with only one of the fillers. However, in this state, there are many gaps within the filler, and not only does the thermal conductivity not increase but also electrical insulating properties deteriorate due to water that has entered the gaps. Therefore, when the third inorganic filler having high thermal conductivity and a smaller particle size than the first and second inorganic fillers is added, there is an advantage of increasing the stability of the material by filling the gap between the first and second inorganic fillers. Thus, compared to a case in which only the first and second inorganic fillers are used, when the third inorganic filler having higher thermal conductivity is added, it is possible to increase thermal conductivity of the cured product. There is no limitation on the inorganic filler used as the third inorganic filler. However, when strong insulation properties are required, boron nitride, aluminum nitride, silicon carbide, and silicon nitride are desirable. On the other hand, when strong insulation properties are not required, a material having high thermal conductivity such as diamond, carbon nanotubes, graphene, and metal powder is desirable. The third inorganic filler may or may not be treated with a silane coupling agent.

A composition for a heat-dissipating member of a fourth aspect of the present invention further includes an organic compound or a polymer compound that is not bonded to the first inorganic filler and the second inorganic filler in the composition for a heat-dissipating member according to any one of the first aspect to the third aspect of the present invention.

In such a configuration, in the composition for a heat-dissipating member obtained by directly connecting the first and second inorganic fillers and performing curing, when the particle size of the filler is increased in order to improve thermal conductivity, the porosity increases accordingly. When voids are filled with a compound that is not bonded, it is possible to improve thermal conductivity and water vapor barrier properties.

According to a composition for a heat-dissipating member of a fifth aspect of the present invention, in the composition for a heat-dissipating member according to any one of the first aspect to the fourth aspect of the present invention, the liquid crystal silane coupling agent is a silane coupling agent represented by the following Formula (1) having a polymerizable group at the terminus.

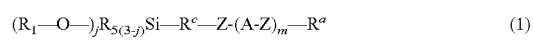

[in Formula (1), $R^a$ is the polymerizable group not containing a —C═C— or —C≡C— moiety;

$R^c$ is an alkylene group having 2 to 3 carbon atoms, and in the alkylene group, any —CH$_2$— except for —C≡C— adjacent to Si is optionally substituted with —CO— or —COO—, —C≡C— adjacent to Si is optionally substituted with —C—CR$^d$—, and R$^d$ is a halogen (Ha) or CHa$_3$;

A is 1,4-cyclohexylene, 1,4-cyclohexenylene, 1,4-phenylene, naphthalene-2,6-diyl, fluorene-2,7-diyl or a divalent group represented by the following Formulae (3-1) to (3-7), and in Formulae (3-1) to (3-7), * indicates an asymmetric carbon atom, in these rings, any —CH$_2$— is optionally substituted with —O—, any —CH═ is optionally substituted with —N═, and any hydrogen atom is optionally substituted with a halogen atom, an alkyl group having 1 to 10 carbon atoms, an alkyl halide having 1 to 10 carbon atoms, or a group in which any —CH$_2$— is substituted with —O—, —CO—, —COO—, —OCO—, —CH═CH— or —C≡C— in the alkyl group or the alkyl halide;

Z independently represent a single bond, an alkylene group having 1 to 20 carbon atoms in which any hydrogen atom is optionally substituted with a halogen atom, or, a group in which any —CH$_2$— is substituted with —O—, —CO—, —COO— or —OCO— in the alkylene group;

m is an integer of 1 to 6;

$R_5$ is a hydrogen atom or an alkyl group having 1 to 8 carbon atoms;

$R_1$ is a hydrogen atom or an alkyl group having 1 to 5 carbon atoms;

j is an integer of 1 to 3]

[Chem. 1]

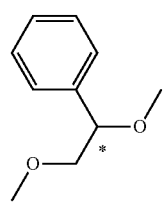

(3-1)

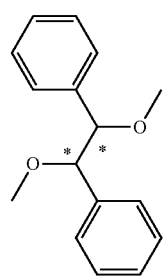

(3-2)

-continued

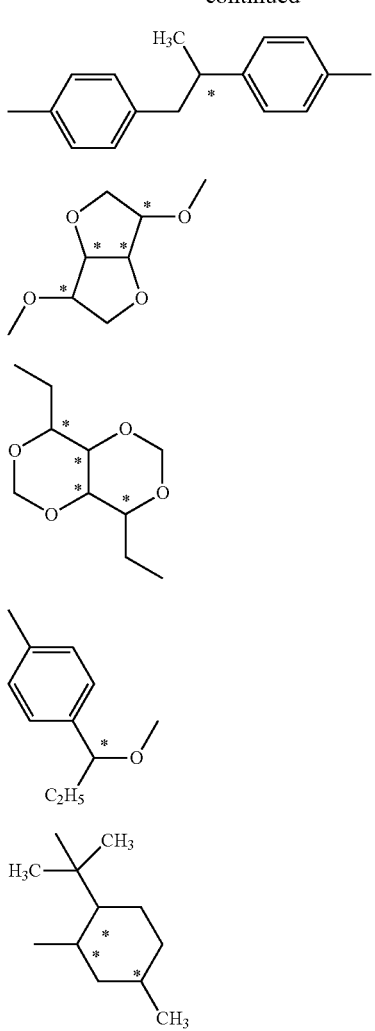

(3-3)

(3-4)

(3-5)

(3-6)

(3-7)

In such a configuration, the liquid crystal silane coupling agent can contain a polymerizable liquid crystal compound in its structure. These compounds are thermosetting and can be cured without being affected by an amount of the filler, and also have excellent heat resistance. In addition, since the molecular structure has symmetry and linearity, these properties are advantageous for conduction of phonons.

According to a composition for a heat-dissipating member of a sixth aspect of the present invention, in the composition for a heat-dissipating member according to the fifth aspect of the present invention, the liquid crystal silane coupling agent of Formula (1) is a silane coupling agent represented by the following Formula (1-1) or (1-2).

[Chem. 2]

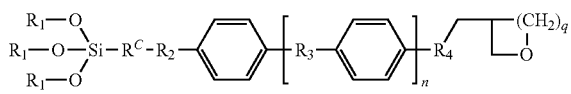

(1-1)

in Formula (1-1),
$R^c$ is —C—C—, —C—C—C—, —C—C—CO—, —C—C—CO—O—, —C—CF—CO—O—, or —C—CCF$_3$—CO—O—, $R_1$ is a methyl or ethyl group,
$R_2$, $R_3$, and $R_4$ independently represent a single bond, —(CH$_2$)$_a$—, —O—, —O(CH$_2$)$_a$—, —(CH$_2$)$_a$O—, —O(CH$_2$)$_a$O—, —COO—, —OCO—, —CH$_2$CH$_2$—COO—, or —OCO—CH$_2$CH$_2$—, and a is an integer of 1 to 6, n is an integer of 1 to 6,
q is 0 or 1;

[Chem. 3]

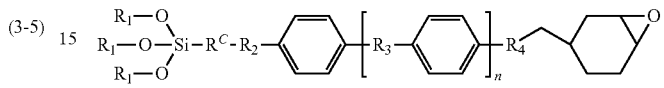

(1-2)

in Formula (1-2),
$R^c$ is —C—C—, —C—C—C—, —C—C—CO—, —C—C—CO—O—, —C—CF—CO—O—, or —C—CCF$_3$—CO—O—, $R_1$ is a methyl or ethyl group,
$R_2$ is a single bond, —(CH$_2$)$_a$—, —O—, —O(CH$_2$)$_a$—, —(CH$_2$)$_a$O—, —O(CH$_2$)$_a$O—, —COO—, —OCO—, —CH$_2$CH$_2$—COO—, or —OCO—CH$_2$CH$_2$—, and a is an integer of 1 to 6, $R_3$ and $R_4$ independently represent a single bond, —(CH$_2$)$_a$—, —O—, O(CH$_2$)$_a$—, —(CH$_2$)$_a$O—, —O(CH$_2$)$_a$O—, —COO—, —OCO—, —CH$_2$CH$_2$—COO—, or —OCO—CH$_2$CH$_2$—, and a is an integer of 1 to 6, n is an integer of 1 to 6.

In such a configuration, the liquid crystal silane coupling agent can contain a particularly preferable compound as a polymerizable liquid crystal compound in its structure. These compounds are thought to have higher molecular linearity and more advantageous phonon conduction. In addition, these compounds are preferable because they have excellent physical properties, ease of production, and ease of handling.

A heat-dissipating member of a seventh aspect of the present invention is a heat-dissipating member obtained by curing the composition for a heat-dissipating member according to any one of the first aspect to the sixth aspect of the present invention.

In such a configuration, the heat-dissipating member has a bond between the inorganic fillers and can have very high thermal conductivity.

An electronic instrument of an eighth aspect of the present invention includes the heat-dissipating member according to the seventh aspect of the present invention; and an electronic device including a heating unit; wherein the heat-dissipating member is disposed on the electronic device such that it comes in contact with the heating unit.

In such a configuration, according to the heat-dissipating member having high thermal conductivity, heat generated in the electronic device can be efficiently conducted. In addition, a thermal expansion coefficient in the planar direction is set to be close to a thermal expansion coefficient of a copper wiring attached to the heat-dissipating member or a semiconductor device of silicon, silicon nitride, or the like, and thus a device that does not easily peel off due to a heat cycle can be produced.

A method for producing a composition for a heat-dissipating member of a ninth aspect of the present invention includes a process of bonding a thermally conductive first inorganic filler to one end of a first coupling agent; and a process of bonding a thermally conductive second inorganic filler to one end of a second coupling agent, wherein at least one of the first coupling agent and the second coupling agent is a liquid crystal silane coupling agent, and wherein the other end of the first coupling agent and the other end of the second coupling agent have functional groups capable of bonding to each other.

In such a configuration, a method for producing a composition for a heat-dissipating member that can form a heat-dissipating member in which inorganic fillers are directly bonded to each other using a liquid crystal silane coupling agent is obtained.

A method for producing a heat-dissipating member of a tenth aspect of the present invention includes the method for producing a composition for a heat-dissipating member according to the ninth aspect of the present invention; and a process of bonding the other end of the first coupling agent to the other end of the second coupling agent.

In such a configuration, a method for producing a heat-dissipating member in which inorganic fillers are directly bonded to each other using a liquid crystal silane coupling agent is obtained.

Advantageous Effects of Invention

The heat-dissipating member formed of the composition for a heat-dissipating member of the present invention has very high thermal conductivity and controllability of a thermal expansion coefficient. In addition, the heat-dissipating member has excellent properties such as chemical stability, heat resistance, hardness and mechanical strength. The heat-dissipating member is suitable for, for example, a heat dissipation board, a heat dissipation plate (planar heatsink), a heat dissipation sheet, a heat dissipation coating, and a heat dissipation adhesive in which thermal distortion is a problem.

DESCRIPTION OF EMBODIMENTS

Figure 1:
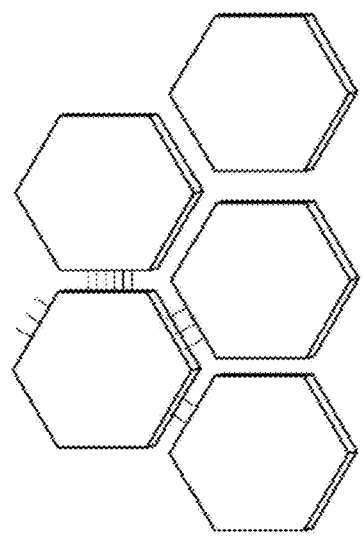
FIG. 1 is a conceptual diagram showing bonding of inorganic fillers using boron nitride as an example in a heat-dissipating member of the present invention.

Priority is claimed on Japanese Patent Application No. 2016-040524, filed Mar. 2, 2016, the content of which is incorporated herein by reference. The present invention will be more completely understood from the following detailed description. Further scope of the application of the present invention will be clearly understood from the following detailed description. It should be understood, however, that the detailed description and the specific examples are preferred embodiments of the present invention and are set forth for the purpose of illustration only. From the detailed description, various modifications and alternations within the spirit and scope of the present invention will be clearly understood by those skilled in the art. The applicants do not intend to present any of the described embodiments to the public and among alternations and alternative proposals, those that are not explicitly included in the scope of claims are parts of the invention under the doctrine of equivalents.

Embodiments of the present invention will be described below with reference to the drawings. Here, in the drawings, the same or corresponding parts will be denoted with the same or similar reference numerals, and redundant descriptions will be omitted. In addition, the present invention is not limited to the following embodiments.

The terms used in this specification are as follows.

A "liquid crystal compound" or a "liquid crystalline compound" is a compound that exhibits a liquid crystal phase such as a nematic phase or a smectic phase.

When it is stated that "any —$CH_2$— in an alkyl group is optionally substituted with —O—" or "any —$CH_2CH_2$— is optionally substituted with —CH=CH—," this means the following for example. For example, examples of groups in which any —$CH_2$— in $C_4H_9$— is substituted with —O— or —CH=CH— include $C_3H_7O$—, $CH_3$—O—$(CH_2)_2$—, and $CH_3$—O—$CH_2$—O—. Similarly, examples of groups in which any —$CH_2CH_2$— in $C_5H_{11}$— is substituted with —CH=CH— include $H_2C$=CH—$(CH_2)_3$—, and $CH_3$—CH=CH—$(CH_2)_2$—, and examples of groups in which any —$CH_2$— is substituted with —O— include $CH_3$—CH=CH—$CH_2$—O—. Thus, the term "any" means "at least one selected without distinction." Here, in consideration of stability of a compound, $CH_3$—O—$CH_2$—O— in which oxygen and oxygen are not adjacent to each other is preferable to $CH_3$—O—O—$CH_2$— in which oxygen and oxygen are adjacent to each other.

In addition, regarding a ring A, when it is stated that "any hydrogen atom is optionally substituted with a halogen, an alkyl group having 1 to 10 carbon atoms, or an alkyl halide having 1 to 10 carbon atoms," this means a case in which, for example, at least one of hydrogen atoms at the 2, 3, 5, and 6 positions on 1,4-phenylene is substituted with a substituent such as a fluorine atom or a methyl atom and a case in which a substituent is "an alkyl halide having 1 to 10 carbon atoms" includes examples such as 2-fluoroethyl and 3-fluoro-5-chlorohexyl.

"Compound (1)" means a compound represented by the following Formula (1) to be described below and may also mean at least one compound represented by the following Formula (1). This also applies to "Compound (1-1)" and "Compound (1-2)." Compound (1), Compound (1-1), and Compound (1-2) are generally referred to as "Compound (1)."

When one Compound (1) includes a plurality of A, any two A may be the same as or different from each other. When a plurality of Compounds (1) include A, any two A may be the same as or different from each other. This rule also applies to other symbols and groups such as $R^a$ and Z. Here, a halogen may be denoted as Ha.

[Composition for a Heat-Dissipating Member]

The composition for a heat-dissipating member is a composition that can form a heat-dissipating member by directly bonding inorganic fillers using a coupling agent through curing treatment. FIG. 1 shows an example in which boron nitride is used as an inorganic filler. When boron nitride (h-BN) is treated with a coupling agent, since boron nitride has no reactive group on the plane of particles, a coupling agent is bonded only to surrounding materials. The coupling agent bonded to boron nitride has functional groups that can be bonded to each other, and thus can form a bond between coupling agents. Therefore, when the other ends of a coupling agent bonded to boron nitride are bonded to each other (refer to FIG. 2), boron nitride molecules are bonded to each other as shown in FIG. 1.

In this manner, when inorganic fillers are bonded to each other using a coupling agent, since phonons can be directly propagated, the cured heat-dissipating member has very high thermal conductivity, and it is possible to produce a composite material in which a thermal expansion coefficient of an inorganic component is directly reflected. Here, in the present invention, a liquid crystal silane coupling agent is used for at least one of coupling agents bonded to the inorganic filler.

Hereinafter, a first coupling agent will be described as a liquid crystal silane coupling agent, and a second coupling agent will be described as a coupling agent other than the liquid crystal silane coupling agent. However, in the present invention, both the first and second coupling agents may be a liquid crystal silane coupling agent.

Figure 2:
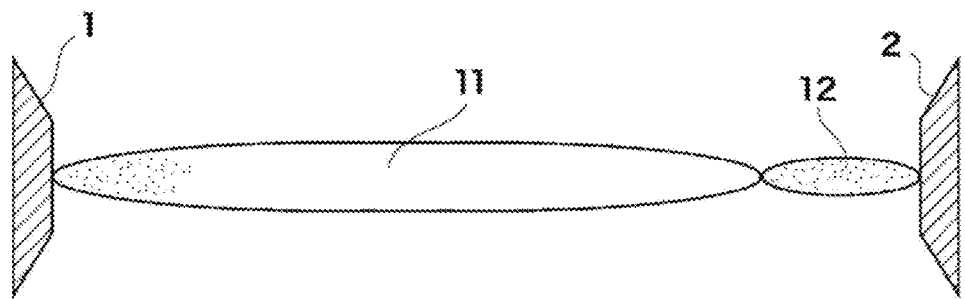
FIG. 2 is a conceptual diagram showing a state in which, when a composition for a heat-dissipating member is cured, the other end of a liquid crystal silane coupling agent as a first coupling agent 11 bonded to a first inorganic filler 1 is bonded to the other end of a second coupling agent 12 bonded to a second inorganic filler 2.

For example, as shown in FIG. 2, a composition for a heat-dissipating member according to a first embodiment of the present invention includes a thermally conductive first inorganic filler 1 bonded to one end of a first coupling agent 11; and a thermally conductive second inorganic filler 2 bonded to one end of a second coupling agent 12. Here, in the composition before curing, the first coupling agent 11 and the second coupling agent 12 are not bonded to each other.

As shown in FIG. 2, when the composition for a heat-dissipating member is cured, the other end of the first coupling agent 11 bonded to the first inorganic filler 1 is bonded to the other end of the second coupling agent 12 bonded to the second inorganic filler 2. In this manner, a bond between the inorganic fillers is formed.

<<Liquid Crystal Silane Coupling Agent>>

The liquid crystal silane coupling agent will be described.

The liquid crystal silane coupling agent has a structure represented by the following Formula (1) including a polymerizable compound and a silicon compound having an alkoxy group in its structure.

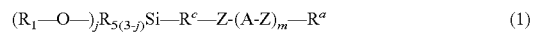

$$(R_1\!-\!\!-\!O\!-\!\!-)_j R_{5(3-j)}Si\!-\!\!-\!R^c\!-\!\!-\!Z\!-\!(A\!-\!Z)_m\!-\!\!-\!R^a \qquad (1)$$

When Compound (1) is mixed with other liquid crystalline compounds or polymerizable compounds, the mixture is likely to be uniform.

When a terminal group $R^a$, a ring structure A and a bond group Z of Compound (1) are appropriately selected, it is possible to arbitrarily adjust physical properties of Compound (1). Effects of types of the terminal group $R^a$, the ring structure A and the bond group Z on physical properties of Compound (1) and preferable examples thereof will be described below.

<Terminal Group $R^a$>

The terminal group R is preferably a polymerizable group not containing a —C=C— or —C≡C— moiety. For example, polymerizable groups represented by the following Formulae (2-1) and (2-2), cyclohexene oxide, and succinic anhydride can be exemplified, but the present invention is not limited thereto.

[Chem. 4]

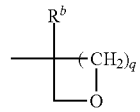

(2-1)

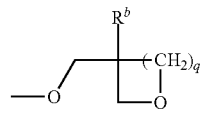

(2-2)

[in Formulae (2-1) and (2-2), $R^b$ is a hydrogen atom, a halogen atom, —CF$_3$, or an alkyl group having 1 to 5 carbon atoms, and q is 0 or 1]

The terminal group R may be a group including a functional group that can be bonded to a functional group of an organic compound (the coupling agent 12 in FIG. 2) which is a binding partner. Examples of a combination of functional groups that can be bonded to each other include a combination of an oxiranyl group and an amino group, a combination of methacryloxy groups, a combination of a carboxy or carboxylic acid anhydride residue and an amino group, and a combination of imidazole and an oxiranyl group, but the present invention is not limited thereto. A combination with high heat resistance is more preferable.

<Ring Structure A>

Examples of a preferable A include 1,4-cyclohexylene, 1,4-cyclohexenylene, 2,2-difluoro-1,4-cyclohexylene, 1,3-dioxane-2,5-diyl, 1,4-phenylene, 2-fluoro-1,4-phenylene, 2,3-difluoro-1,4-phenylene, 2,5-difluoro-1,4-phenylene, 2,6-difluoro-1,4-phenylene, 2,3,5-trifluoro-1,4-phenylene, pyridine-2,5-diyl, 3-fluoropyridine-2,5-diyl, pyrimidine-2,5-diyl, pyridazine-3,6-diyl, naphthalene-2,6-diyl, tetrahydronaphthalene-2,6-diyl, fluorene-2,7-diyl, 9-methylfluorene-2,7-diyl, 9,9-dimethylfluorene-2,7-diyl, 9-ethylfluorene-2,7-diyl, 9-fluorofluorene-2,7-diyl, 9,9-difluorofluorene-2,7-diyl, and divalent groups represented by the above Formulae (3-1) to (3-7).

Regarding the configuration of 1,4-cyclohexylene and 1,3-dioxane-2,5-diyl, a trans configuration is preferable to a cis configuration. Since 2-fluoro-1,4-phenylene and 3-fluoro-1,4-phenylene are structurally the same, the latter is not shown. This rule also applies to a relationship between 2,5-difluoro-1,4-phenylene and 3,6-difluoro-1,4-phenylene.

Examples of a more preferable A include 1,4-cyclohexylene, 1,4-cyclohexenylene, 1,3-dioxane-2,5-diyl, 1,4-phenylene, 2-fluoro-1,4-phenylene, 2,3-difluoro-1,4-phenylene, 2,5-difluoro-1,4-phenylene, and 2,6-difluoro-1,4-phenylene. Examples of a particularly preferable A include 1,4-cyclohexylene and 1,4-phenylene.

<Bond Group Z>

When the bond group Z of Compound (1) is a single bond, —(CH$_2$)$_2$—, —CH$_2$O—, —OCH$_2$—, —CF$_2$O—, —OCF$_2$—, or —(CH$_2$)$_4$—, and particularly, is a single bond, —(CH$_2$)$_2$—, —CF$_2$O—, —OCF$_2$—, or —(CH$_2$)$_4$—, the viscosity decreases. In addition, when the bond group Z is —CH=N—, —N=CH—, or —N=N—, a temperature range of a liquid crystal phase is wide. In addition, when the bond group Z is an alkyl group having about 4 to 10 carbon atoms, a melting point is lowered.

Examples of a preferable Z include a single bond, —(CH$_2$)$_2$—, —(CF$_2$)$_2$—, —COO—, —OCO—, —CH$_2$O—, —OCH$_2$—, —CF$_2$O—, —OCF$_2$—, —(CH$_2$)—, —(CH$_2$)$_3$O—, —O(CH$_2$)$_3$—, —(CH$_2$)$_2$COO—, —OCO(CH$_2$)$_2$—, —CONR$_6$—, and —NR$_6$CO— (R$_6$ is a hydrogen atom or an alkyl group having 1 to 6 carbon atoms).

Examples of a more preferable Z include a single bond, —(CH$_2$)$_2$—, —COO—, —OCO—, —CH$_2$O—, —OCH$_2$—, —CF$_{20}$—, and —OCF$_2$—. Examples of a particularly preferable Z include a single bond, —(CH$_2$)$_2$—, —COO— and —OCO—.

When Compound (1) has 3 or fewer rings, the viscosity is low and when Compound (1) has 3 or more rings, a clearing point is high. Here, in this specification, a condensed ring basically including a 6-membered ring and a 6-membered ring or the like is regarded as a ring. For example, a 3-membered ring, a 4-membered ring, or a 5-membered ring alone is not regarded as a ring. In addition, a condensed ring such as a naphthalene ring and a fluorene ring is regarded as one ring.

Compound (1) may be optically active or optically inactive. When Compound (1) is optically active, Compound (1) may have an asymmetric carbon atom or may have axial asymmetry. The configuration of an asymmetric carbon atom may be R or S. The asymmetric carbon atom may be positioned at either R$^a$ or A. When the asymmetric carbon atom is included, the compatibility of Compound (1) is favorable. When Compound (1) has axial asymmetry, a twisting induction force is large. In addition, optical rotation is inconsequential in any case.

As described above, when types of the terminal group R$^a$, the ring structure A and the bond group Z, and the number of rings are appropriately selected, it is possible to obtain a compound having desired physical properties.

Here, in Compound (1), m is an integer of 1 to 6.

<Bond Group R$^c$>

In Compound (1), a bond group R$^c$ is an alkylene group having 2 to 3 carbon atoms, and in the alkylene group, any —CH$_2$— except for —C≡C— adjacent to Si is optionally substituted with —CO— or —COO—, —C≡C— adjacent to Si is optionally substituted with —C—CR$^d$— and R$^d$ is a halogen (Ha) or CHa$_3$.

Examples of a preferable R include —C—C—, —C—C—C—, —C—C—CO—, —C—C—CO—O—, —C—CF—CO—O—, and —C—CCF$_3$—CO—O—. A particularly preferable R is —C—C—.

<(R$_1$—O—)$_j$R$_{5(3-j)}$Si—>

In (R$_1$—O—)$_j$R$_{5(3-j)}$Si— of Compound (1), R$_1$ is a hydrogen atom or an alkyl group having 1 to 5 carbon atoms. Examples of a preferable R$_1$ include a methyl group and an ethyl group. R$_5$ is a hydrogen atom or a linear or branched alkyl group having 1 to 8 carbon atoms. Examples of a preferable R$_5$ include a methyl group. j is an integer of 1 to 3. A preferable j is 3.

<Compound (1)>

Compound (1) can be represented by the following Formula (1-a) or (1-b).

P—Y-(A-Z)m-R$^a$ (1-a)

P—Y-(A-Z)m-Y—R$^a$ (1-b)

In the above Formulae (1-a) and (1-b), A, Z, and R have the same definitions as A, Z, and R defined in the above Formula (1), and P indicates (R$_1$—O—)$_j$R$_{5(3-j)}$Si—R$^c$—. Y is a single bond or an alkylene group having 1 to 20 carbon atoms, and preferably an alkylene group having 1 to 10 carbon atoms, and in the alkylene group, any —CH$_2$— is optionally substituted with —O—, —S—, —CO—, —COO—, or —OCO—. A particularly preferable Y is an alkylene group in which —CH$_2$— at one end or both ends of an alkylene group having 1 to 10 carbon atoms is substituted with —O—. m is an integer of 1 to 6, preferably an integer of 2 to 6, and more preferably an integer of 2 to 4.

Preferable examples of Compound (1) include the following Compounds (a-1) to (g-14).

[Chem. 5]

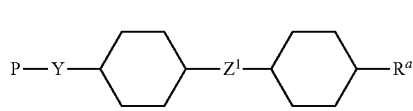

(a-1)

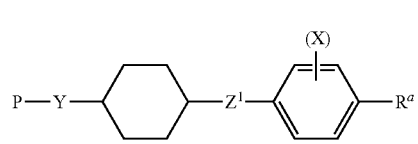

(a-2)

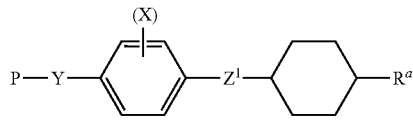

(a-3)

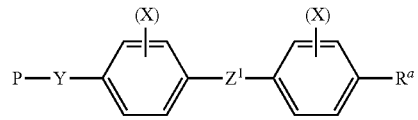

(a-4)

-continued
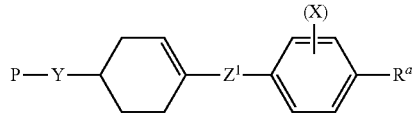 (a-5)
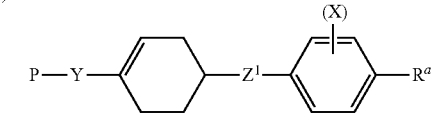 (a-6)
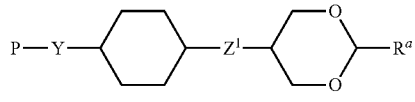 (a-7)
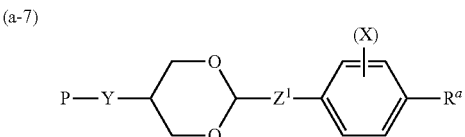 (a-8)
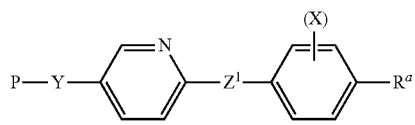 (a-9)
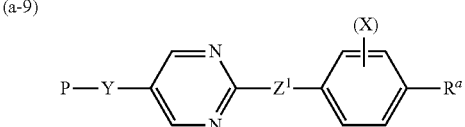 (a-10)
[Chem. 6]
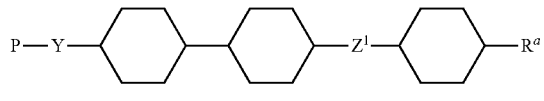 (b-1)
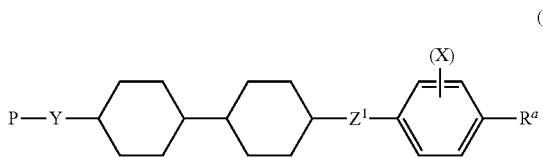 (b-2)
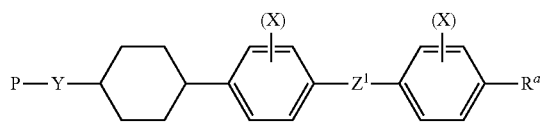 (b-3)
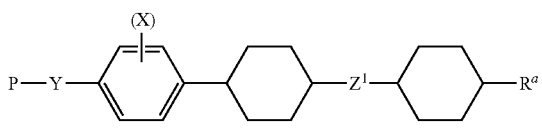 (b-4)
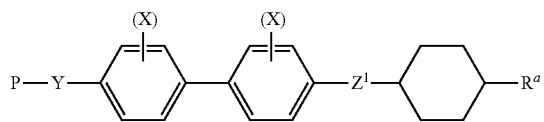 (b-5)
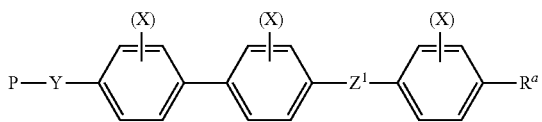 (b-6)
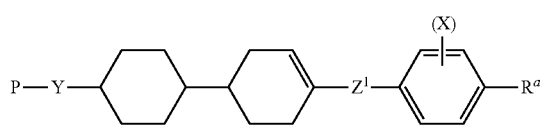 (b-7)
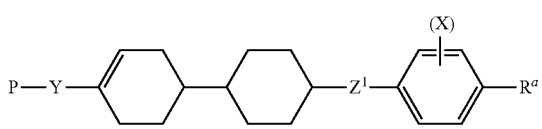 (b-8)
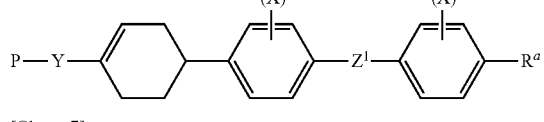 (b-9)
[Chem. 7]
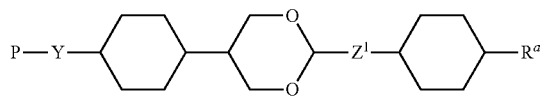 (b-10)
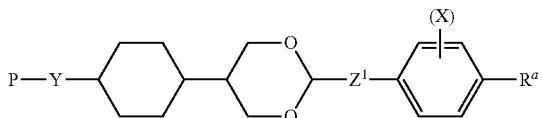 (b-11)
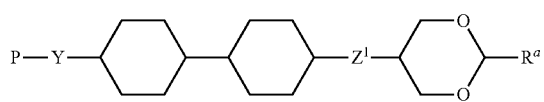 (b-12)
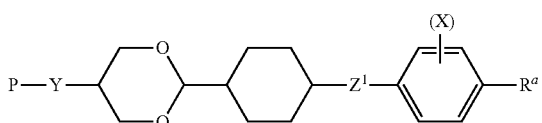 (b-13)

-continued
(b-14) 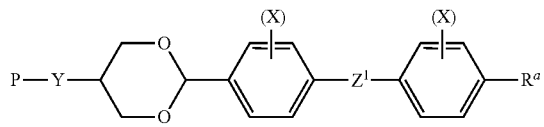
(b-15) 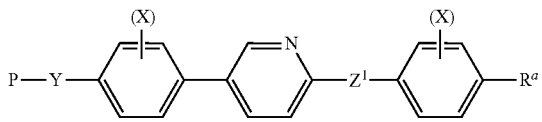
(b-16) 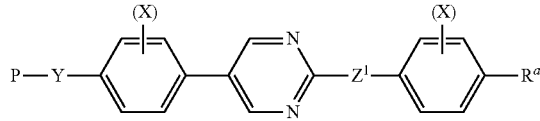
[Chem. 8]
(c-1) 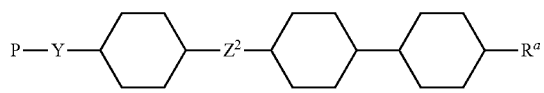
(c-2) 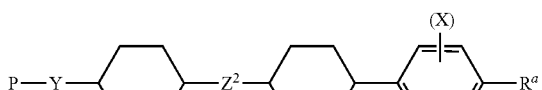
(c-3) 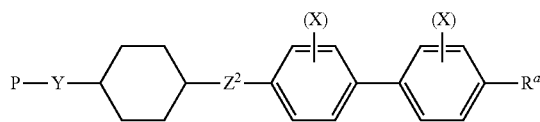
(c-4) 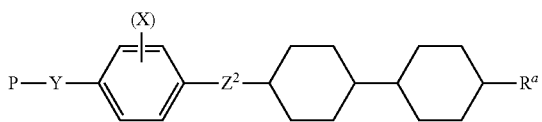
(c-5) 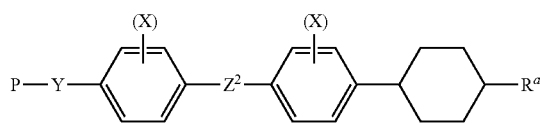
(c-6) 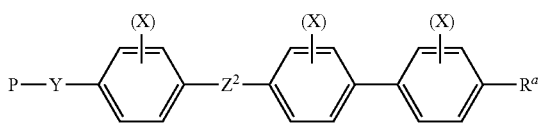
(c-7) 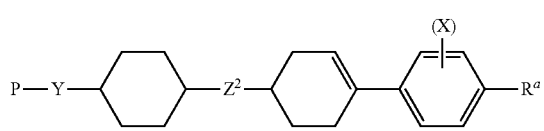
(c-8) 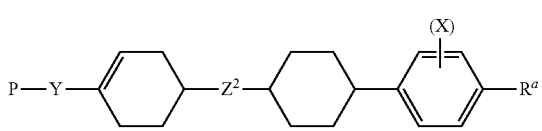
(c-9) 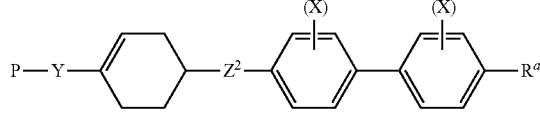
[Chem. 9]
(c-10) 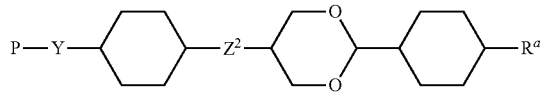
(c-11) 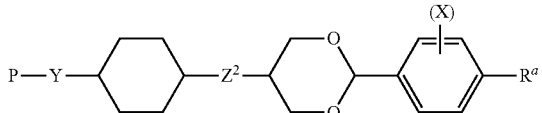
(c-12) 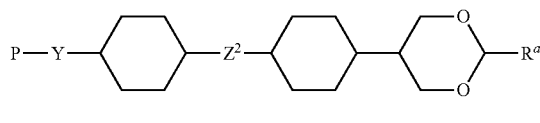
(c-13) 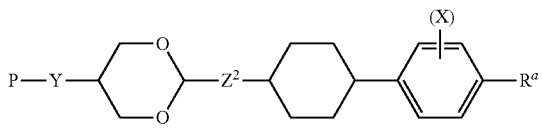
(c-14) 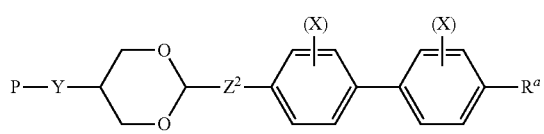
(c-15) 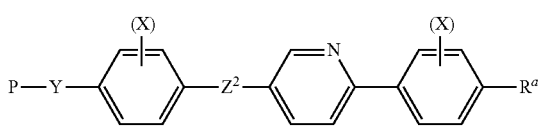

-continued
(c-16)
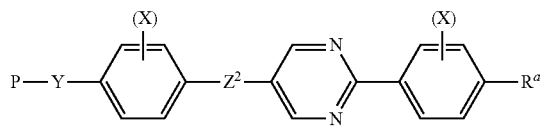
[Chem. 10]
(d-1)
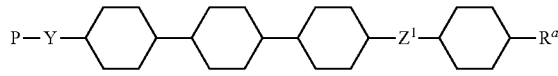
(d-2)
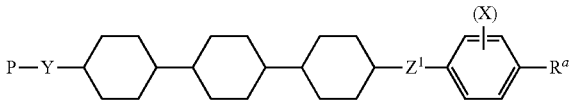
(d-3)
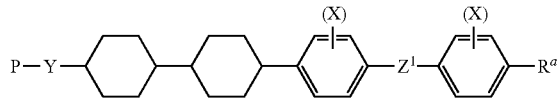
(d-4)
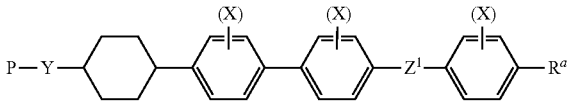
(d-5)
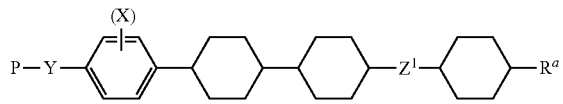
(d-6)
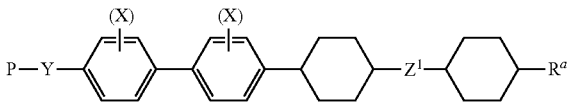
(d-7)
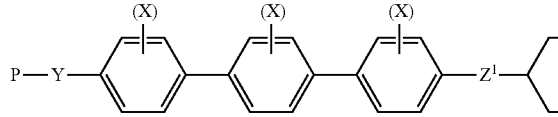
[Chem. 11]
(d-8)
(d-9)
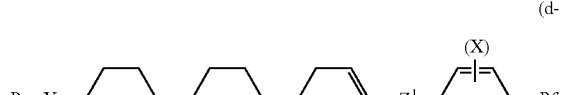
(d-10)
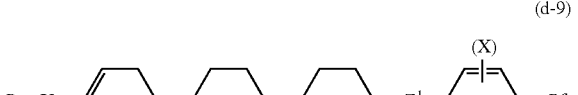
(d-11)
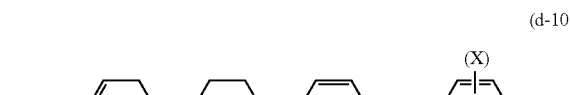
(d-12)
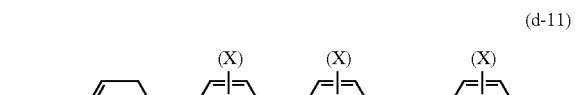
(d-13)
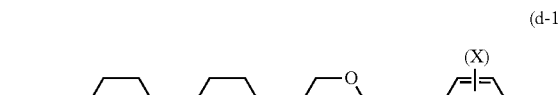
(d-14)
(d-15)
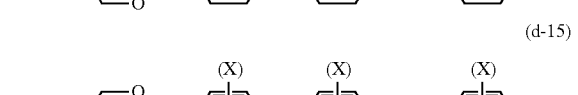
[Chem. 12]
(e-1)
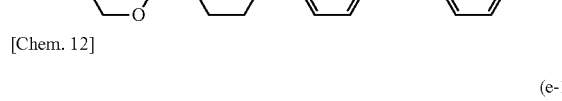
(e-2)
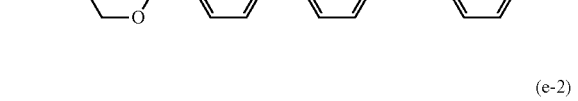
(e-3)
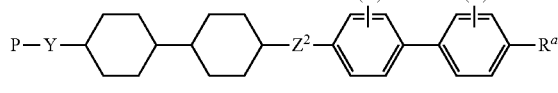
(e-4)
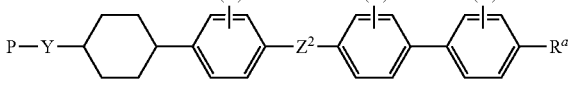

-continued
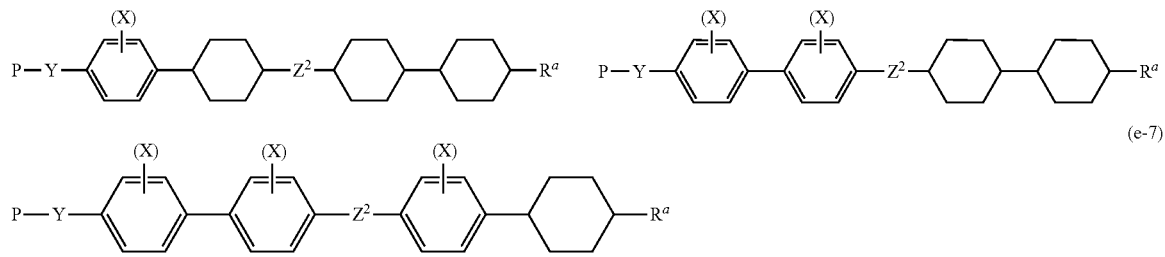
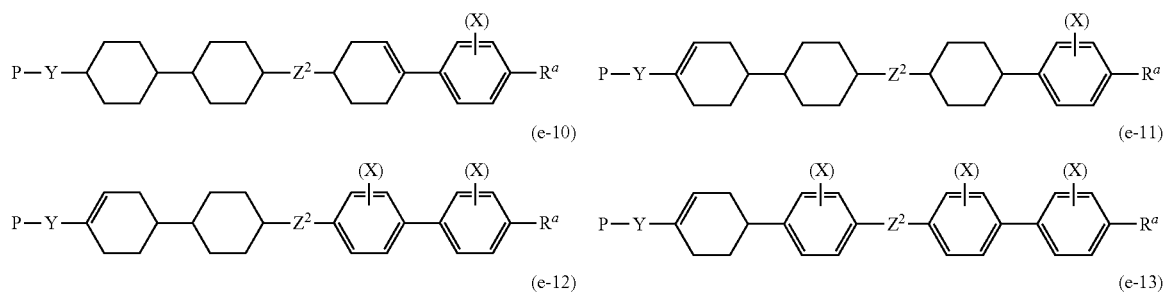
[Chem. 14]
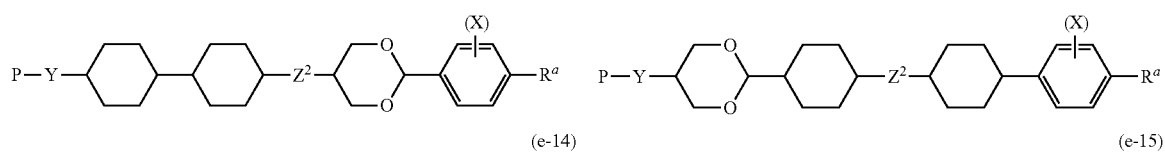
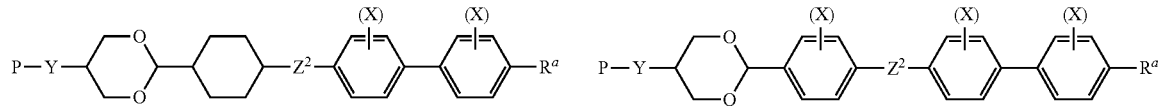
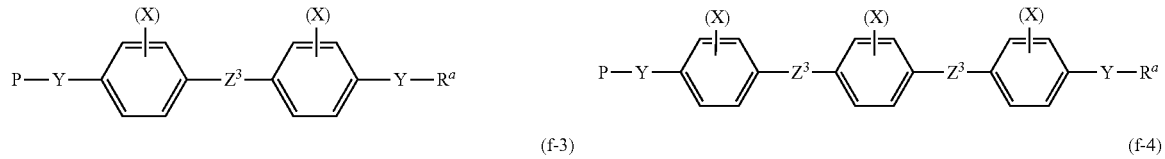
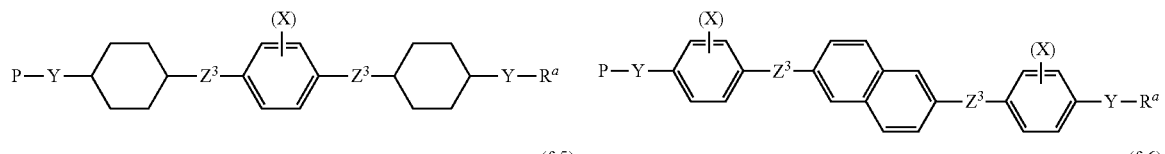
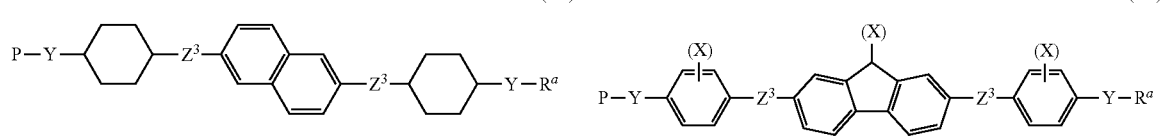
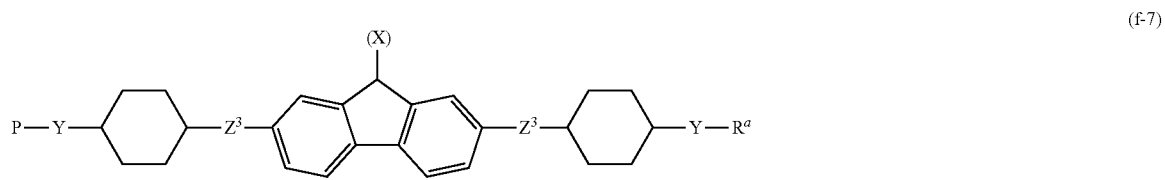

-continued
[Chem. 15]
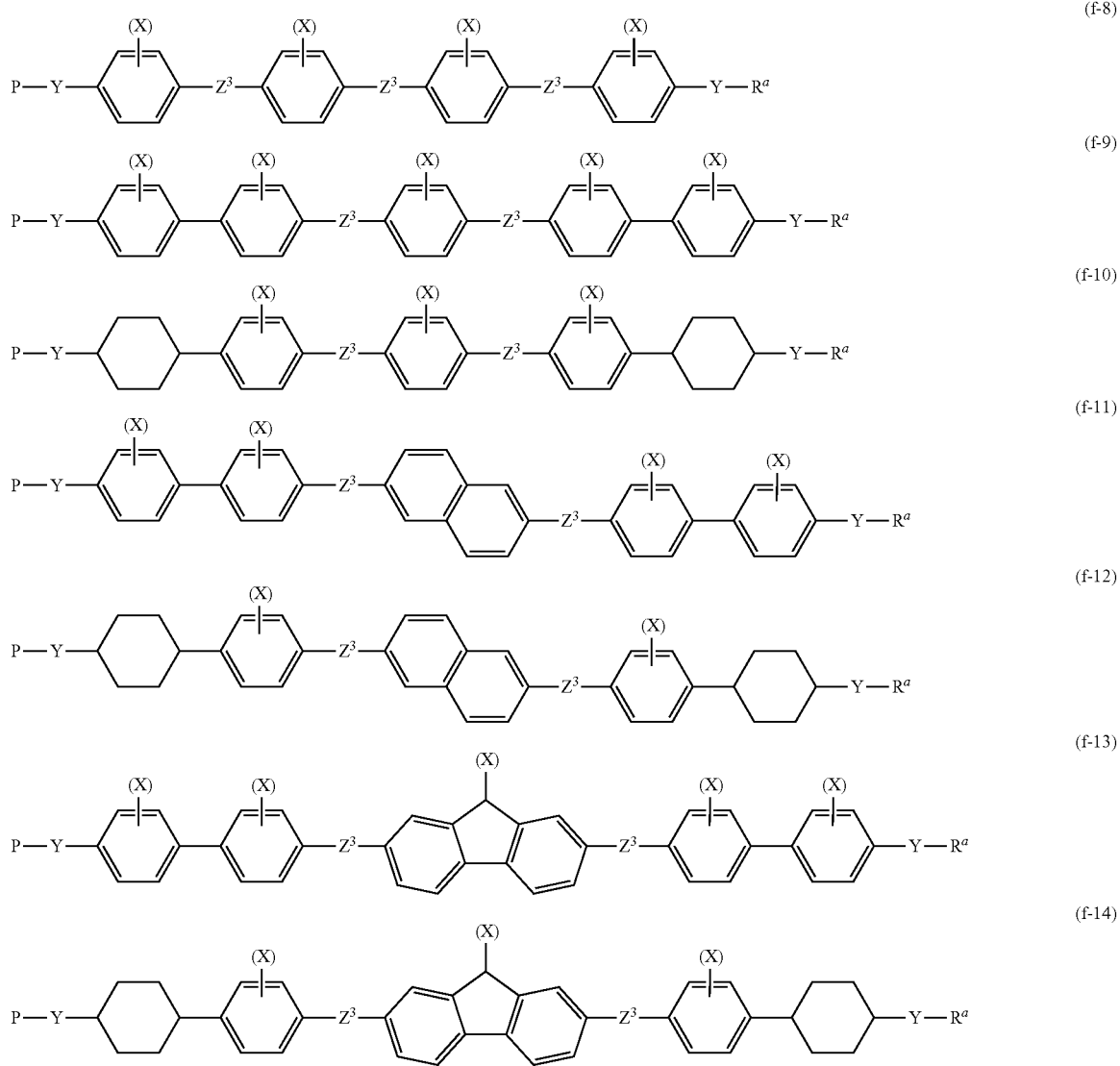
[Chem. 16]
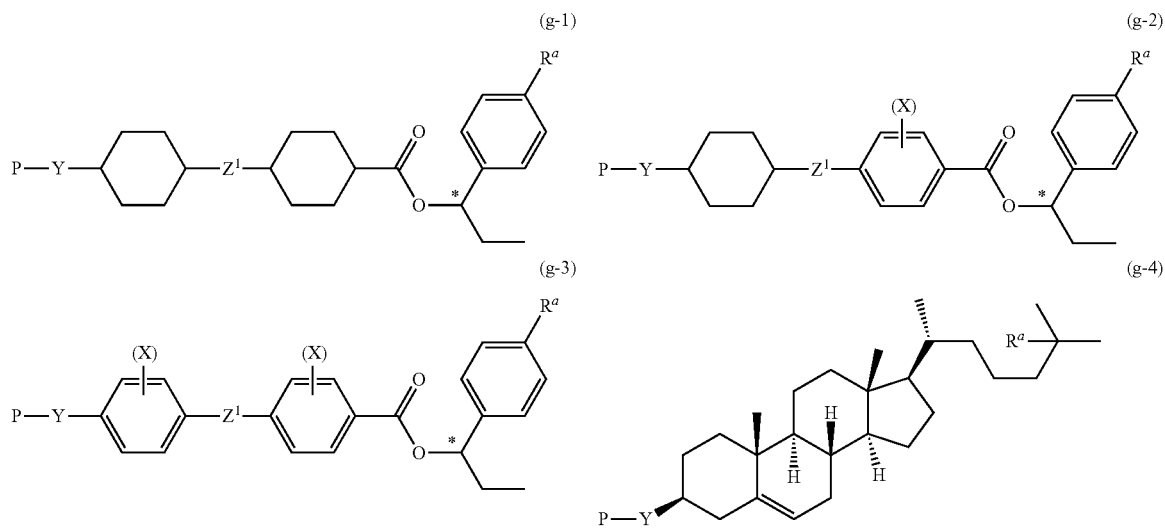

-continued
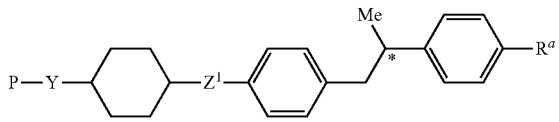
(g-5)
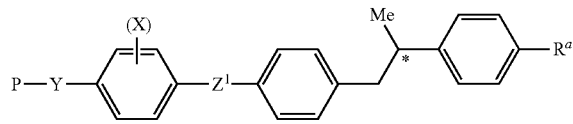
(g-6)
[Chem. 17]
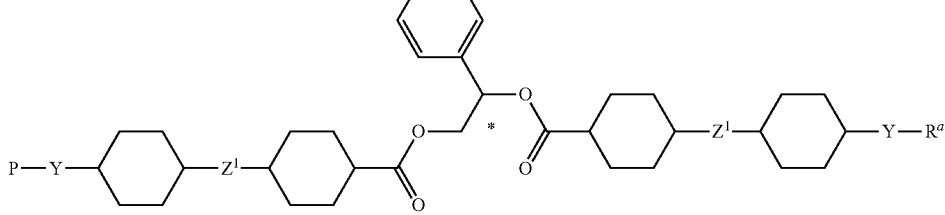
(g-7)
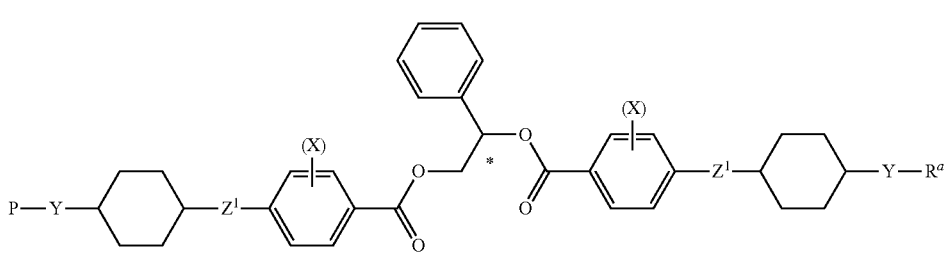
(g-8)
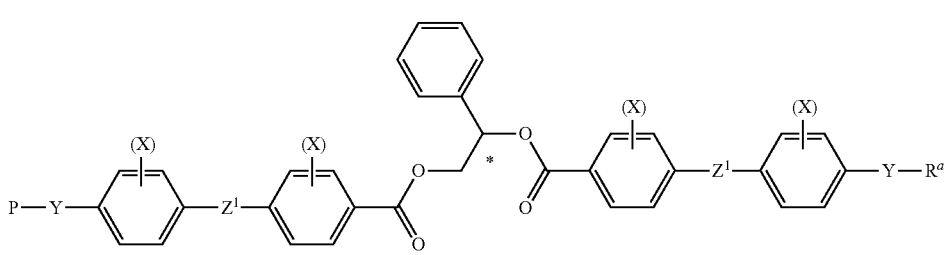
(g-9)
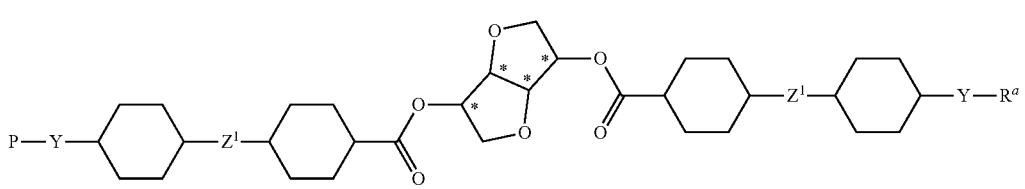
(g-10)
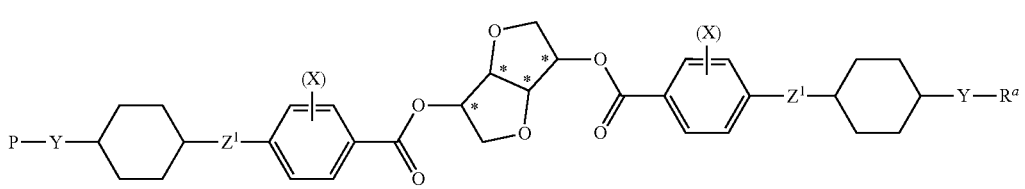
(g-11)
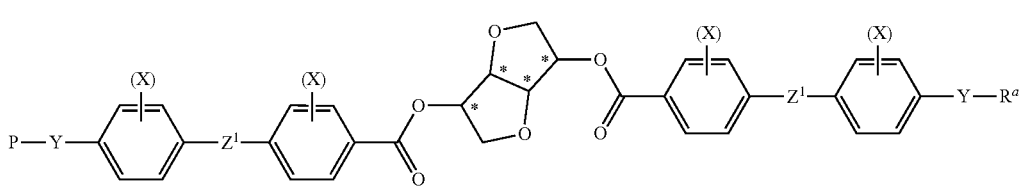
(g-12)
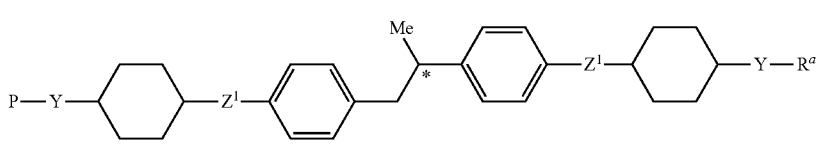
(g-13)

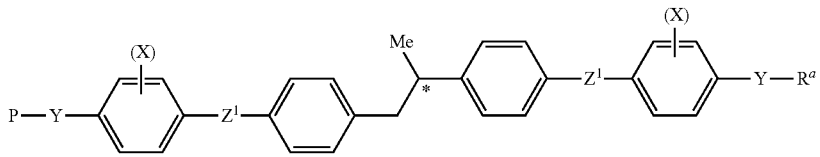

(g-14)

In the above chemical formula, $R^a$, P and Y are defined in the above Formulae (1-a) and (1-b).

$Z^1$ is a single bond, —(CH$_2$)$_2$—, —(CF$_2$)$_2$—, —(CH$_2$)$_4$—, —CH$_2$O—, —OCH$_2$—, —(CH$_2$)$_3$O—, —O(CH$_2$)$_3$—, —COO—, —OCO—, —(CH$_2$)$_2$COO—, —OCO(CH$_2$)$_2$—, —CH=N—, —N=CH—, —N=N—, —OCF$_2$— or —CF$_2$O—, —CONR$_6$—, or —NR$_6$CO—(R$_6$ is a hydrogen atom or an alkyl group having 1 to 6 carbon atoms). Here, a plurality of $Z^1$ may be the same as or different from each other.

$Z^2$ is —(CH$_2$)$_2$—, —(CF$_2$)$_2$—, —(CH$_2$)$_4$—, —CH$_2$O—, —OCH$_2$—, —(CH$_2$)$_3$O—, —O(CH$_2$)$_3$—, —COO—, —OCO—, —(CH$_2$)$_2$COO—, —OCO(CH$_2$)$_2$—, —OCF$_2$— or —CF$_2$O—, —CONR$_6$—, or —NR$_6$CO—(R$_6$ is a hydrogen atom or an alkyl group having 1 to 6 carbon atoms).

$Z^3$ is a single bond, an alkyl group having 1 to 10 carbon atoms, —(CH$_2$)$_a$—, —O(CH$_2$)$_a$O—, —CH$_2$O—, —OCH$_2$—, —O(CH$_2$)$_3$—, —(CH$_2$)$_3$O—, —COO—, —OCO—, —(CH$_2$)$_2$COO—, —OCO(CH$_2$)$_2$—, —OCF$_2$— or —CF$_2$O—, —CONR$_6$—, or —NR$_6$CO—(R$_6$ is a hydrogen atom or an alkyl group having 1 to 6 carbon atoms), and a plurality of $Z^3$ may be the same as or different from each other.

X is a substituent of 1,4-phenylene and fluorene-2,7-diyl in which any hydrogen atom is optionally substituted with a halogen atom, an alkyl group, or alkyl fluoride, and represents a halogen atom, an alkyl group or alkyl fluoride.

* indicates an asymmetric carbon atom.

More preferable forms of Compound (1) will be described. A more preferable Compound (1) can be represented by the following Formula (1-c) or (1-d).

(1-c)

(1-d)

In the above formulae, A, Y, Z, P and m are as defined as above, and $R^a$ represents a polymerizable group represented by the following Formulae (4-1) to (4-6). In the above Formula (1-d), two Y represent the same group and two Y are bonded to each other so that they are symmetric.

[Chem. 18]

(4-1)

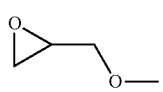

(4-2)

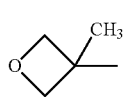

(4-3)

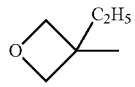

(4-4)

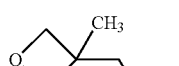

(4-5)

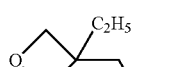

(4-6)

<Coupling Agent Other than Liquid Crystal Silane Coupling Agent>

Since it is preferable that a coupling agent (hereinafter referred to as another coupling agent) other than the liquid crystal silane coupling agent react with a functional group (oxiranyl or the like) of the liquid crystal silane coupling agent, a coupling agent having an amine reactive group at the terminus is preferred. Examples of the coupling agent include Sila-Ace (registered trademark) S310, S320, S330, and S360 (commercially available from JNC) and KBM903 and KBE903 (commercially available from Shin-Etsu Chemical Co., Ltd.).

Here, when the terminus of the liquid crystal silane coupling agent is an amine, a coupling agent having an oxiranyl group or the like at the terminus is preferable. Examples of the coupling agent include Sila-Ace (registered trademark) S510 and S530 (commercially available from JNC). Here, modification of inorganic fillers using a coupling agent is preferable because the number of bonds increases as the number of modifications increases.

<Inorganic Fillers>

Examples of the first inorganic filler and the second inorganic filler include a nitride, a carbide, and a carbon material. The first inorganic filler and the second inorganic filler may be the same as or different from each other.

Specifically, regarding the first inorganic filler and the second inorganic filler, examples of an inorganic filler having high thermal conductivity and a very small or negative thermal expansion coefficient include boron nitride, boron carbide, boron carbonitride, graphite, carbon fibers, carbon nanotubes, and graphene. In addition, alumina, silica, aluminum nitride, silicon carbide, zinc oxide, magnesium hydroxide and an iron oxide-based material can be exemplified. In addition, the following inorganic filler having high thermal conductivity and a positive thermal expansion coefficient may be used as either the first inorganic filler or the second inorganic filler.

Examples of a third inorganic filler include an inorganic filling material and a metal filling material such as alumina, silica, boron nitride, boron carbide, silicon carbide, aluminum nitride, silicon nitride, diamond, carbon nanotubes, graphite, graphene, silicon, beryllia, magnesium oxide, aluminum oxide, zinc oxide, silicon oxide, copper oxide, titanium oxide, cerium oxide, yttrium oxide, tin oxide, holmium oxide, bismuth oxide, cobalt oxide, calcium oxide, magnesium hydroxide, aluminum hydroxide, gold, silver, copper, platinum, iron, tin, lead, nickel, aluminum, magnesium, tungsten, molybdenum, and stainless steel, which have high thermal conductivity or a smaller size than the first and second inorganic fillers.

It is desirable that a structure of the liquid crystal silane coupling agent have a shape and a length at which these inorganic fillers can be efficiently directly bonded to each other. A type, a shape, a size, and an addition amount of an inorganic filler can be appropriately selected depending on the purpose. When insulation properties are necessary for the obtained heat-dissipating member, an inorganic filler having conductivity may be used as long as desired insulation properties are maintained. Examples of the shape of the inorganic filler include a plate shape, a spherical shape, an amorphous shape, a fibrous shape, a rod shape, and a tubular shape.

Boron nitride, aluminum nitride, silicon nitride, silicon carbide, graphite, carbon fibers, and carbon nanotubes are preferable. In particular, hexagonal boron nitride (h-BN) and aluminum nitride are preferable. Boron nitride is preferable because thermal conductivity in the planar direction is very high, a thermal expansion coefficient in the planar direction is negative, a dielectric constant is low, and insulation properties are strong. For example, plate-like crystal boron nitride is preferably used because the plate-like structure is likely to be aligned according to a mold due to a flow and a pressure of a raw material during molding and curing. Since aluminum nitride has very high thermal conductivity and a small positive thermal expansion coefficient, and has a clumped form, when it is used together with boron nitride, alignment of the plate-like structure of boron nitride is disturbed and, anisotropy of thermal conductivity in the planar direction and the thickness direction is reduced while high thermal conductivity is maintained, and a thermal expansion coefficient can be adjusted in the positive direction, and thus it is preferable.

An average particle size of the inorganic filler is preferably 0.1 to 200 μm, and more preferably, 1 to 100 μm. When the average particle size is 0.1 μm or more, thermal conductivity is favorable, and when the average particle size is 200 μm or less, a filling rate can increase.

Here, in this specification, the average particle size is based on particle size distribution measurement using a laser diffraction and scattering method. That is, using analysis according to the Fraunhofer diffraction theory and the Mie scattering theory, powder is divided into two sides from a certain particle size using a wet method, and a size at which the larger side and the smaller side are equal (based on the volume) is set as a median size.

Proportions of the inorganic filler and the coupling agent depend on an amount of the coupling agent bonded to the inorganic filler used. A compound used as the first and second inorganic fillers, for example, boron nitride, does not have a reactive group on its surface as described above and has a reactive group only on its side. Preferably, as much coupling agent as possible is bonded to few reactive groups, and the same number of or slightly more organic compound molecules as or than the number of reactive groups are bonded thereto. An amount of the coupling agent reacted with the inorganic filler varies mainly depending on the size of the inorganic filler and the reactivity of the coupling agent used. For example, when the inorganic filler is larger, since an area ratio of the side of the inorganic filler is smaller, an amount of modification is smaller. Although it is desirable to react as much coupling agent as possible, when particles become smaller, since thermal conductivity of the product is lowered, it is preferable to keep a balance.

A volume ratio between the silane coupling agent and the inorganic component in the heat-dissipating member which is a cured product is desirably in a range of 5:95 to 30:70, and more desirably in a range of 10:90 to 25:75. The inorganic component is an inorganic raw material before a silane coupling agent treatment or the like is performed.

The first inorganic filler is modified with the liquid crystal silane coupling agent as a first coupling agent. The second inorganic filler is modified with a silane coupling agent other than the liquid crystal silane coupling agent as a second coupling agent. As shown in FIG. 2, the first inorganic filler and the second inorganic filler whose surfaces are modified with the coupling agent can form a bond between the liquid crystal silane coupling agent and another silane coupling agent, and the bond greatly contributes to thermal conduction.

A liquid crystal silane coupling agent that contains a polymerizable liquid crystal compound in its structure is preferable. However, other polymerizable liquid crystal compounds may be included and a polymerizable compound having no liquid crystallinity may be included.

<Other Components>

The composition for a heat-dissipating member may further contain an organic compound (for example, a polymerizable compound or a polymer compound) that is not bonded to the first inorganic filler and the second inorganic filler, that is, does not contribute to bonding, and may contain a polymerization initiator, a solvent, and the like.

<Polymerizable Compound that is not Bonded>

The composition for a heat-dissipating member may contain a polymerizable compound that is not bonded to an inorganic filler as a component. As such a polymerizable compound, a compound that does not degrade film forming properties and mechanical strength is preferable. Polymerizable compounds are classified into compounds having no liquid crystallinity and compounds having liquid crystallinity. Examples of the polymerizable compound having no liquid crystallinity include vinyl derivatives, styrene derivatives, (meth)acrylic acid derivatives, sorbic acid derivatives, fumaric acid derivatives, and itaconic acid derivatives. Regarding a content, first, desirably, a composition for a heat-dissipating member that does not contain a polymerizable compound which is not bonded is produced, a porosity thereof is measured, and the polymerizable compound is added in an amount at which voids are filled.

<Polymer Compound that is not Bonded>

The composition for a heat-dissipating member may contain a polymer compound that is not bonded to an inorganic filler as a component. As such a polymer compound, a compound that does not degrade film forming properties and mechanical strength is preferable. The polymer compound may be a polymer compound that does not react with the inorganic filler and the liquid crystal silane coupling agent. Examples of the polymer compound include a polyolefin resin, a polyvinyl resin, a polyamide resin, and a polyitaconic acid resin. Regarding a content, first, desirably, a composition for a heat-dissipating member that does not contain a polymer compound which is not bonded is produced, a porosity thereof is measured, and the polymer compound is added at an amount in which voids are filled.

<Non-Polymerizable Liquid Crystalline Compound>

The composition for a heat-dissipating member may contain a liquid crystalline compound having no polymerizable group as a component. Examples of such a non-polymerizable liquid crystalline compound are described in the liquid crystalline compound database LiqCryst (LCI Publisher GmbH, Hamburg, Germany), and the like. When the composition containing a non-polymerizable liquid crystalline compound is polymerized, for example, it is possible to obtain composite materials of the polymer of Compound (1) and the liquid crystalline compound. In such composite materials, a non-polymerizable liquid crystalline compound is present in a polymer network such as a polymer dispersed liquid crystal. Therefore, a liquid crystalline compound having properties such that it has no fluidity in a temperature range in which it is used is desirable. Combining may be performed in such a manner in which, after the filler is cured, it is injected into voids in a temperature range in which an isotropic phase is exhibited, or a filler may be polymerized by mixing in an amount of the liquid crystalline compound calculated in advance such that voids are filled in the filler.

<Polymerization Initiator>

The composition for a heat-dissipating member may contain a polymerization initiator as a component. As the polymerization initiator, according to components and a polymerization method of the composition, for example, a photoradical polymerization initiator, a photocationic polymerization initiator, and a thermal radical polymerization initiator may be used.

Examples of a preferable initiator for thermal radical polymerization include benzoyl peroxide, diisopropyl peroxydicarbonate, t-butyl peroxy-2-ethylhexanoate, t-butyl peroxypivalate, di-t-butyl peroxide (DTBPO), t-butyl peroxydiisobutyrate, lauroyl peroxide, dimethyl 2,2'-azobisisobutyrate (MAIB), azobisisobutyronitrile (AIBN), and azobiscyclohexanecarbonitrile (ACN).

<Solvent>

The composition for a heat-dissipating member may contain a solvent. When a component that needs to be polymerized is contained in the composition, polymerization may be performed in a solvent or without a solvent. The composition containing a solvent may be applied onto a substrate, using, for example, a spin coating method, and then photopolymerized after the solvent is removed. Alternatively, after photocuring, heating may be performed to an appropriate temperature, curing may be performed by heating and thus a post treatment may be performed.

Examples of a preferable solvent include benzene, toluene, xylene, mesitylene, hexane, heptane, octane, nonane, decane, tetrahydrofuran, γ-butyrolactone, N-methyl pyrrolidone, dimethylformamide, dimethylsulfoxide, cyclohexane, methylcyclohexane, cyclopentanone, cyclohexanone, and PGMEA. The above solvents may be used alone, or two or more types thereof may be used in combination.

Here, there is little point in limiting a proportion of a solvent used during polymerization. In consideration of polymerization efficiency, solvent cost, energy cost, and the like, the proportion may be determined for each case.

<Others>

In order to facilitate handling, a stabilizer may be added to the composition for a heat-dissipating member. As such a stabilizer, a known stabilizer can be used without limitation. Examples of the stabilizer include hydroquinone, 4-ethoxyphenol, and 3,5-di-t-butyl-4-hydroxytoluene (BHT).

In addition, an additive (such as an oxide) may be added in order to adjust the viscosity or color of the composition for a heat-dissipating member. For example, titanium oxide for exhibiting white, carbon black for exhibiting black, and a fine silica powder for adjusting the viscosity can be exemplified. In addition, an additive may be added in order to further increase mechanical strength. For example, as inorganic fibers such as glass and carbon fibers, cloth, or a polymer additive, fibers or long molecules of polyvinyl formal, polyvinyl butyral, polyester, polyamide, and polyimide may be exemplified.

[Production Method]

A method for producing a liquid crystal silane coupling agent, a method for producing a composition for a heat-dissipating member, and a method for producing a heat-dissipating member from a composition for a heat-dissipating member will be described below in detail.

<Method for Producing a Liquid Crystal Silane Coupling Agent>

The liquid crystal silane coupling agent contains a polymerizable compound and a silicon compound having an alkoxy group in its structure, and the production method includes the following Steps (1) to (3).

(1) Obtaining a polymerizable compound

A polymerizable compound is obtained. Preferably, the polymerizable compound has a functional group at both ends. It is preferable that a functional group be provided at both ends on the long side of the polymerizable compound because it is then possible to form a linear bond (crosslinking) using a coupling agent.

The polymerizable compound may be a bifunctional or higher polymerizable liquid crystal compound. For example, the following Formula (5-1) having a vinyl group at both ends can be exemplified.

[Chem. 19]

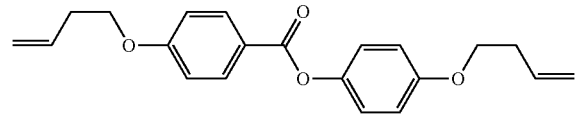

(5-1)

The polymerizable compound may be synthesized or a commercially available product may be purchased.

The polymerizable compound can be synthesized by combining methods known in the field of organic synthetic chemistry. A method of introducing a desired terminal group, ring structure, and bond group into a starting material is described in books such as, for example, Houben-Wyle (Methods of Organic Chemistry, Georg Thieme Verlag, Stuttgart), Organic Syntheses (John Wily & Sons, Inc.), Organic Reactions (John Wily & Sons Inc.), Comprehensive Organic Synthesis (Pergamon Press), and New Experimental Chemistry Course (Maruzen). In addition, Japanese Patent No. 5084148 may be referred to.

(2) Introducing a Polymerizable Group into any One End of the Polymerizable Compound For example, a case in which an epoxy group is introduced as a polymerizable group will be described. In a reaction in which an epoxy group is introduced (epoxidized) into both ends of the above Formula (5-1) and the following Formula (5-4) is generated, when the reaction is stopped midway, the following Formulae (5-2) and (5-3) having an epoxy group at any one end can be obtained as an intermediate product. The generated following Formulae (5-2) and (5-3) can be obtained by dissolving in a solvent, performing separation using a separator, and then removing the solvent.

In this manner, a desired polymerizable group is introduced into any one end by removing the intermediate product.

[Chem. 20]

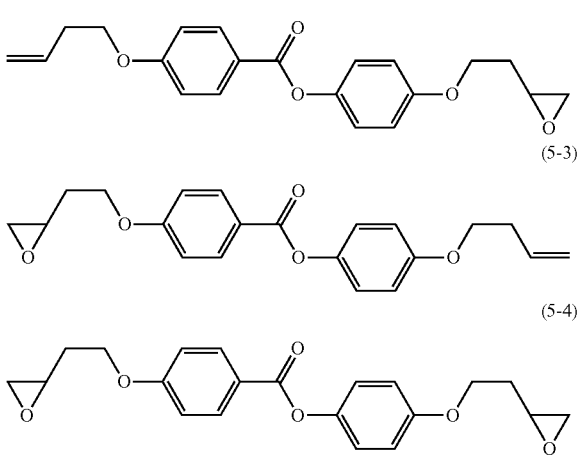

A solvent that removes the intermediate product may be any solvent in which the generated intermediate product can be dissolved. Examples of the solvent include ethyl acetate, benzene, toluene, xylene, mesitylene, hexane, heptane, octane, nonane, decane, tetrahydrofuran, γ-butyrolactone, N-methyl pyrrolidone, dimethylformamide, dimethylsulfoxide, cyclohexane, methylcyclohexane, cyclopentanone, cyclohexanone, and PGMEA. The above solvents may be used alone, or two or more types thereof may be used in combination.

Here, there is little point in limiting a proportion of the solvent used. In consideration of solubility, solvent cost, energy cost, and the like, the proportion may be determined for each case.

Here, for the intermediate product, a compound having an epoxy group and a compound having a vinyl group may be synthesized in advance and finally etherified. According to such synthesis, compounds of the following Formulae (5-5) and (5-6) are obtained.

[Chem. 21]

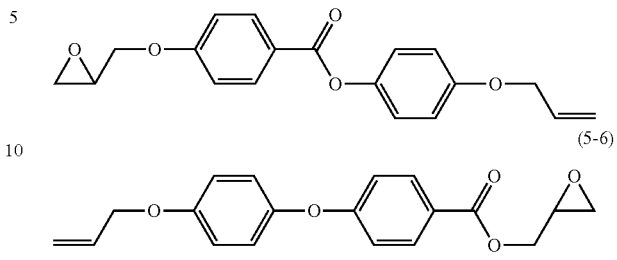

(3) Introducing Si into an Unreacted End of the Polymerizable Compound

A silicon compound having an alkoxy group may be bonded to an unreacted end of the polymerizable compound.

For example, a trimethoxysilyl group may be introduced into an unreacted functional group (vinyl) side of the above Formulae (5-2), (5-3), and (5-5). The following Formulae (6-1), (6-2), and (6-3) may be referred to. Here, introduction of Si may be introduction of a triethoxysilyl group. However, regarding methoxysilane and ethoxysilane, methoxysilane that is highly reactive is preferable.

In addition, some methoxy or ethoxy groups may be substituted with a linear or branched alkyl group having 1 to 8 carbon atoms. For example, methyl, ethyl, n-propyl, i-propyl, n-butyl, s-butyl, t-butyl, and n-octyl groups may be exemplified.

[Chem. 22]

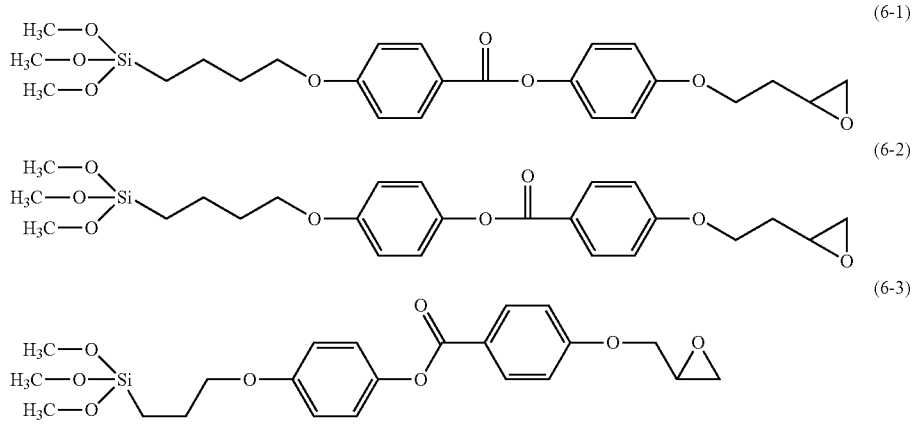

In the method for producing a liquid crystal silane coupling agent, as an example, in a polymerizable compound having a vinyl group at both ends, first, a vinyl group at one end is epoxidized and next, Si is introduced into the other unreacted vinyl group for production. However, the production method of the present invention is not limited thereto. Both ends of the polymerizable compound are not limited to a vinyl group as long as a polymerizable group and Si can be introduced.

In addition, while Si may be introduced into the above long chain compound using a hydrosilylation reaction, a liquid crystal silane coupling agent may be synthesized such that the left half and the right half of a long chain compound are first separately synthesized, Si is introduced into the left half using a hydrosilylation reaction, a polymerizable group is introduced into the right half, and the left half and the right half are then connected to each other.

<Method for Producing a Composition for a Heat-Dissipating Member>

(1) Performing a Coupling Treatment

A coupling treatment is performed on an inorganic filler, and that obtained by bonding one end of a coupling agent to an inorganic filler are referred to as the first inorganic filler and the second inorganic filler. The coupling treatment can be performed using a known method. The coupling agent used for the first inorganic filler and the coupling agent used for the second inorganic filler may be the same type or different types in which respective organic reactive groups have polymerizability.

As an example, first, the inorganic filler and the coupling agent are added to a solvent. After stirring is performed using a stirrer or the like, drying is performed. After the solvent is dried, a heat treatment is performed under vacuum conditions using a vacuum dryer or the like. A solvent is added to the inorganic filler and pulverization is performed using an ultrasonic treatment. This solution is separated and purified using a centrifuge. After the supernatant is discarded, the solvent is added, and the same operation is performed several times. The inorganic filler subjected to a coupling treatment after purification is dried using an oven.

(2) Mixing

The first inorganic filler and the second inorganic filler on which a coupling treatment is performed are weighed out such that, for example, weights of only the inorganic fillers are 1:1, and mixing is performed using an agate mortar or the like. Then, mixing is performed using two rollers and the like, and a composition for a heat-dissipating member is obtained.

Regarding a mixing ratio between the first inorganic filler and the second inorganic filler, when bond groups that form a bond of the first inorganic filler and the second inorganic filler are amino:epoxy groups, for example, weights of only the inorganic fillers are preferably 1:1 to 1:30, and more preferably 1:3 to 1:20. The mixing ratio is determined according to the number of terminal bond groups that form a bond of the first inorganic filler and the second inorganic filler. For example, in the case of a secondary amine, since it can react with two oxiranyl groups, it can be used in a smaller amount compared to the oxiranyl side, and since the oxiranyl side may be ring-opened, a greater amount than that computed from the epoxy equivalent is preferably used.

<Method for Producing a Heat-Dissipating Member>

As an example, a method for producing a film as a heat-dissipating member using a composition for a heat-dissipating member will be described. A composition for a heat-dissipating member is inserted between heating plates using a compression molding machine and aligned, cured and molded by compression molding. In addition, post-curing is performed using an oven or the like, and a heat-dissipating member of the present invention is obtained. Here, a pressure during compression molding is preferably 50 to 200 $kgf/cm^2$ and more preferably 70 to 180 $kgf/cm^2$. Basically, a higher pressure during curing is preferable. However, a pressure is appropriately changed according to the fluidity of the mold and desired physical properties (in which direction to emphasize the thermal conductivity in), and an appropriate pressure is preferably applied.

Here, some of the composition for a heat-dissipating member is a solid (for example, powdery) at room temperature, but it has fluidity when heated to 40° C. to 140° C., and preferably, 70 to 120° C. At a temperature at which such a composition for a heat-dissipating member is softened or higher and at a temperature at which reactive groups begin to react or lower, the composition for a heat-dissipating member can be beneficial for a molding method such as transfer molding, and is also useful as a sealing material of a semiconductor or the like. When a temperature at which fluidity is exhibited is higher than a polymerization temperature of an organic reactive group of the silane coupling agent, a curing reaction also occurs simultaneously with molding, but powder press molding, powder injection molding, or the like can be used, and the composition can be beneficially used for an insulating substrate, an insulating sheet, a molded part or the like with high thermal conductivity.

In addition, a method for producing a film as a heat-dissipating member using a composition for a heat-dissipating member containing a solvent will be described in detail.

First, the composition is applied to a substrate, the solvent is dried and removed, and a coating layer with a uniform film thickness is formed. Examples of the coating method include spin coating, roll coating, curtain coating, flow coating, printing, micro gravure coating, gravure coating, wire bar coating, dip coating, spray coating, and a meniscus coating method.

The solvent can be dried and removed by, for example, air-drying at room temperature, drying on a hot plate, drying in a drying furnace, blowing warm air or hot air, or the like. Conditions for removing the solvent are not particularly limited, and it is sufficient to perform drying until the solvent is substantially removed and the fluidity of a coating layer disappears.

Examples of the substrate include metal substrates of copper, aluminum, iron and the like; inorganic semiconductor substrates of silicon, silicon nitride, gallium nitride, and zinc oxide; glass substrates of alkali glass, borosilicate glass, and flint glass, and inorganic insulating substrates of alumina and aluminum nitride; and plastic film substrates of polyimide, polyamideimide, polyamide, polyetherimide, polyether ether ketone, polyether ketone, polyketone sulfide, polyethersulfone, polysulfone, polyphenylene sulfide, polyphenylene oxide, polyethylene terephthalate, polybutylene terephthalate, polyethylene naphthalate, polyacetal, polycarbonate, polyarylate, an acrylic resin, polyvinyl alcohol, polypropylene, cellulose, triacetyl cellulose, and partially saponified products thereof, and an epoxy resin, a phenol resin, a norbornene resin, and the like.

The film substrate may be a uniaxially stretched film or a biaxially stretched film. The film substrate may be subjected to a surface treatment such as a saponification treatment, a corona treatment, or a plasma treatment in advance. Here, on such film substrates, a protective layer that is not affected by the solvent contained in the composition for a heat-dissipating member may be formed. Examples of a material used for the protective layer include a polyvinyl alcohol. In addition, an anchor coat layer may be formed in order to improve the adhesion between the protective layer and the substrate. For such an anchor coat layer, any of inorganic and organic materials may be used as long as it can improve the adhesion between the protective layer and the substrate.

A case in which a bond between the inorganic fillers is composed of an inorganic filler treated with a liquid crystal silane coupling agent and an inorganic filler treated with another coupling agent has been described above. Specifically, for example, the first inorganic filler is subjected to a coupling treatment using a liquid crystal silane coupling agent having an epoxy group at the terminus. The second inorganic filler is subjected to a coupling treatment using another silane coupling agent having an amino group. Finally, the epoxy group on the side of the first inorganic filler and the amino group on the side of the second inorganic filler are bonded to each other (refer to FIG. 2). Here, a combination in which the first inorganic filler side has an amino group and the second inorganic filler side has an epoxy group may be used.

In this manner, the coupling agent bonded to the first inorganic filler and the coupling agent bonded to the second inorganic filler each have a functional group for bonding coupling agents. The functional group on the side of the first inorganic filler and the functional group on the side of the second inorganic filler may be a combination of different types of functional groups or a combination of the same type of functional group as long as it is possible to bond coupling agents to each other.

Examples of a combination of functional groups that form a bond between coupling agents include a combination of an oxiranyl group and an amino group, a combination of vinyl groups, a combination of methacryloxy groups, a combination of a carboxy or carboxylic acid anhydride residue and an amino group, and a combination of imidazole and an oxiranyl group, but the present invention is not limited thereto. A combination with high heat resistance is more preferable.

In this manner, when the first coupling agent and the second coupling agent are appropriately selected, it is possible to connect the first inorganic filler and the second inorganic filler. It is possible to obtain a heat-dissipating member having very high thermal conductivity, controllability of a thermal expansion coefficient, and heat resistance from the composition for a heat-dissipating member of the present invention. Here, the above functional groups are only examples, and the present invention is not limited to the above functional groups as long as effects of the present invention can be obtained.

[Heat-Dissipating Member]

A heat-dissipating member according to a second embodiment of the present invention is obtained by molding a cured product obtained by curing the composition for a heat-dissipating member according to the first embodiment according to an application. The cured product has high thermal conductivity and has a negative thermal expansion coefficient or a very small positive thermal expansion coefficient, and has excellent chemical stability, heat resistance, hardness, and mechanical strength. Here, the mechanical strength refers to a Young's modulus, tensile strength, tear strength, bending strength, flexural modulus of elasticity, impact strength, or the like.

Regarding conditions for curing a composition for a heat-dissipating member according to thermal polymerization, a thermosetting temperature is in a range of room temperature to 350° C., preferably in a range of room temperature to 250° C., and more preferably in a range of 50° C. to 200° C., and a curing time is in a range of 5 seconds to hours, preferably in a range of 1 minute to 5 hours, and more preferably in a range of 5 minutes to 1 hour. After polymerization, preferably, gradual cooling is performed in order to reduce stress strain and the like. In addition, a reheating treatment may be performed to alleviate distortion and the like.

The heat-dissipating member of the present invention is formed of the composition for a heat-dissipating member, and used in the form of a plate, a sheet, a film, a thin film, fibers, an adhesive, a molded article or the like. A preferable form is a form of a plate, a sheet, a film or a thin film. Here, in this specification, a film thickness of a sheet is 1 mm or more, a film thickness of a film is 5 μm or more, preferably 10 to 500 μm, and more preferably 20 to 300 μm, and a film thickness of a thin film is less than 5 μm. The film thickness may be appropriately changed according to applications.

[Electronic Instrument]

An electronic instrument of an electronic substrate according to a third embodiment of the present invention includes the heat-dissipating member according to the second embodiment and an electronic device including a heating unit. The heat-dissipating member is disposed on the electronic device such that it comes in contact with the heating unit.

Examples of the electronic device include a semiconductor device. The heat-dissipating member has high heat resistance, and strong insulation properties in addition to high thermal conductivity. Therefore, it is particularly effective for an insulated gate bipolar transistor (IGBT) which requires a more efficient heat dissipation mechanism for high power among semiconductor devices. An IGBT is one of semiconductor devices and is a bipolar transistor in which an MOSFET is incorporated in a gate part, and is used for power control. Examples of the electronic instrument including an IGBT include a main conversion element of a high power inverter, an uninterruptible power system, a variable voltage variable frequency control device of an AC motor, a control device of a railway vehicle, a hybrid vehicle, an electric transport device such as an electric vehicle, and an IH cooking device.

In the composition for a heat-dissipating member, using only an inorganic filler modified with a liquid crystal silane coupling agent, polymerizable compounds in the liquid crystal silane coupling agent are bonded to each other according to an appropriate polymerization initiator or the like, and a bond between the inorganic fillers may be formed.

That is, according to the present invention, in combining an inorganic material and an organic compound, a bond is formed between inorganic materials according to the organic compound, thermal conductivity is significantly improved, and additionally, a thermal expansion coefficient is controlled.

EXAMPLES

The present invention will be described below in detail with reference to examples. However, the present invention is not limited to the details described in the following examples.

<Liquid Crystal Silane Coupling Agent>

A liquid crystal silane coupling agent having a heat resistance: a mixture of the following formulae (6-1) and (6-2)

A liquid crystal silane coupling agent having a heat resistance: the following formula (6-3)

The liquid crystal silane coupling agents used in the present invention were synthesized as follows. First, a polymerizable liquid crystal compound was synthesized and then subjected to a procedure of forming a silane coupling agent.

<Synthesis of Liquid Crystal Silane Coupling Agent>

A polymerizable liquid crystal compound of the following Formula (5-1) was synthesized by a method described in Japanese Patent No. 5084148, and a vinyl group was epoxidized by a method described in the same Japanese Patent No. 5084148. During an epoxidation reaction, (5-1) became (5-4) via (5-2) and (5-3). While appropriately checking a product using thin layer chromatography and a UV lamp, when formation of (5-4) began, the reaction was stopped using an ice bath. Further, using a column into which a silica gel was filled, a mixture of (5-2) and (5-3) was separated using a solvent in which toluene/ethyl acetate were mixed at a volume ratio of 5:1. The solvent was evaporated from the solution containing (5-2) and (5-3) using a rotary evaporator, and thereby a mixture of (5-2) and (5-3) was obtained.

[Chem. 23]

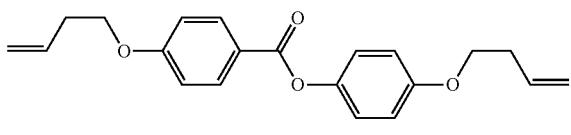
(5-1)

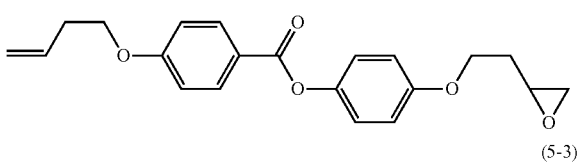
(5-2)

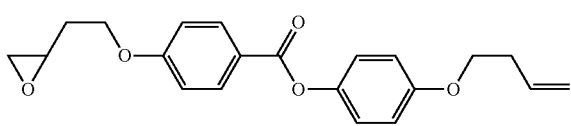
(5-3)

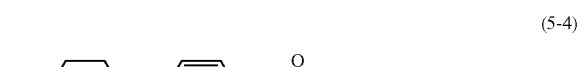

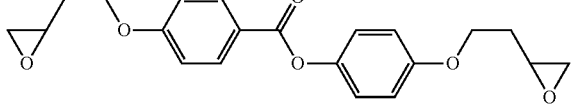
(5-4)

According to esterification of (5-8) produced using epichlorohydrin from the following Formula (5-7), and (5-10) produced using allyl bromide from the following Formula (5-9), a compound of (5-5) was obtained. Using thin layer chromatography and a fluorescent lamp appropriately, when formation of (5-5) began, the reaction was stopped. Further, using a column into which a silica gel was filled, impurities were separated out using a solvent in which toluene/ethyl acetate were mixed at a volume ratio of 5:1. The solvent was evaporated using a rotary evaporator, and thereby a compound of (5-5) was obtained.

[Chem. 24]

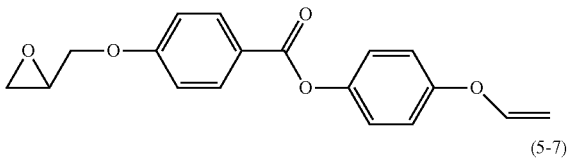
(5-5)

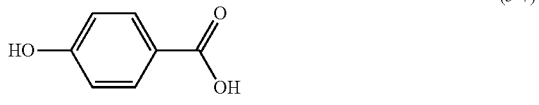
(5-7)

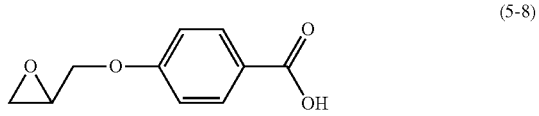
(5-8)

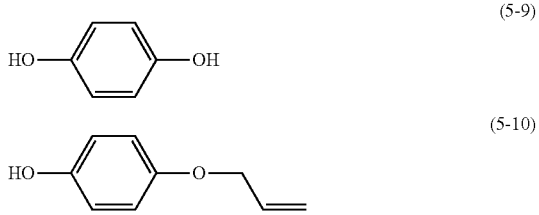
(5-9)

(5-10)

Under a nitrogen atmosphere, 1.5 g of trimethoxysilane was added to 4.0 g of the mixture of (5-2) and (5-3), and the mixture was stirred at 70° C. After a predetermined temperature was reached, 2 μL of a Karstedt catalyst diluted to 1/10 was added, and a polymerizable liquid crystal compound and trimethoxysilane were reacted. Sampling was performed every hour, a concentration of trimethoxysilane was checked using infrared absorption spectroscopy and gas chromatography, and the temperature was maintained at 70° C. until the concentration became constant. Then, using a rotary evaporator, the residual solvent and a silicon compound with a low boiling point were evaporated, and thereby silane coupling agents (6-1) and (6-2) used in the present invention were obtained. The final structure and a reaction progress state were checked using $^1$H-NMR.

Figure 5:
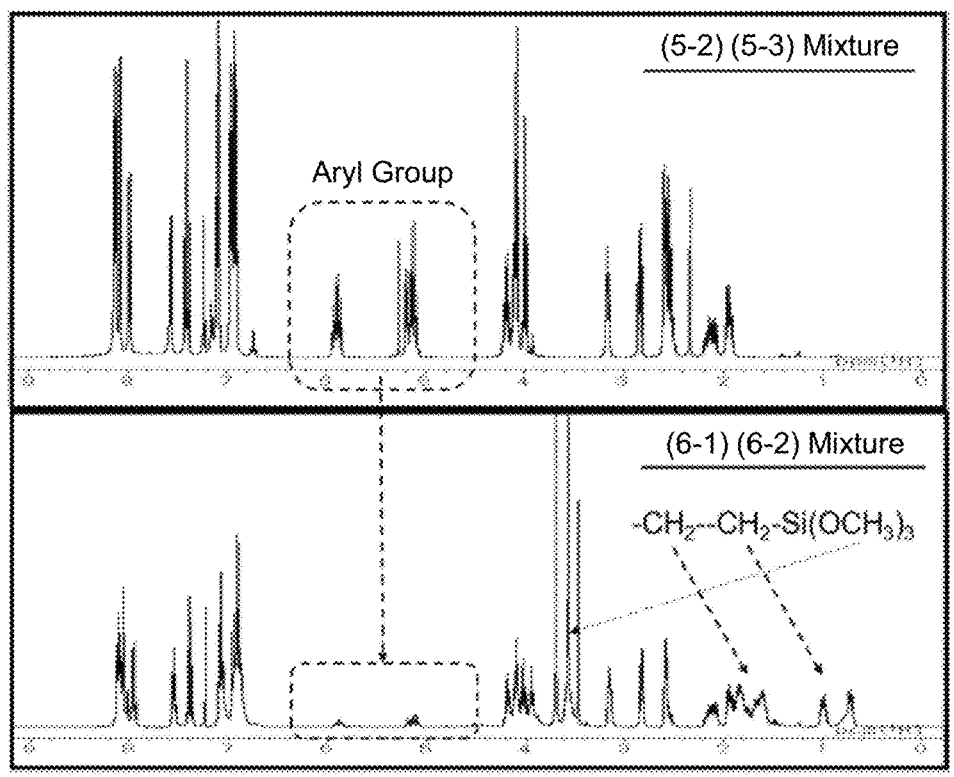
FIG. 5 is a $^1$H-NMR chart showing final structures of liquid crystal silane coupling agents (6-1) and (6-2) having a heat resistance of the present invention synthesized in an example and a progress state of a reaction.

The $^1$H-NMR chart is shown in FIG. 5.

$^1$H-NMR (CDCl$_3$): 8.35-8.07 (d, 2H), 7.60-6.74 (m, 6H), 4.11 (m, 4H), 3.58 (s, 9H), 3.18 (m, 1H), 2.86 (m, 1H), 2.76 (m, 1H), 2.25-1.60 (m, 4H), 1.05 (m, 2H), 0.75 (m, 2H).

Under a nitrogen atmosphere, 1.5 g of trimethoxysilane was added to 4.0 g of (5-5), and the mixture was stirred at 70° C. After a predetermined temperature was reached, 2 μL of a Karstedt catalyst was added, and polymerizable liquid crystal compound and trimethoxysilane were reacted at 70° C. for 6 hours. Then, using a rotary evaporator, a low boiling point component such as a solvent was distilled off at 80° C. and 5 mmHg, and thereby a silane coupling agent (6-3) used for the present invention was obtained. The final structure and a reaction progress state were checked using $^1$H-NMR.

Figure 6:
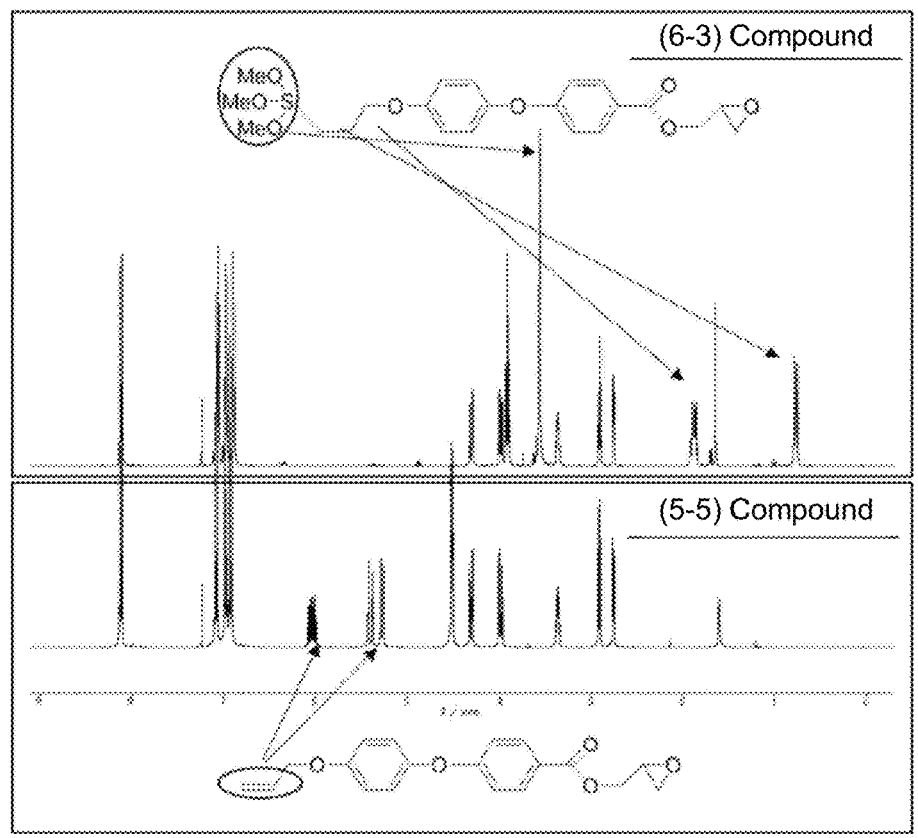
FIG. 6 is a $^1$H-NMR chart showing a final structure of a liquid crystal silane coupling agent (6-3) having a heat resistance of the present invention synthesized in an example and a progress state of a reaction.
Figure 7:
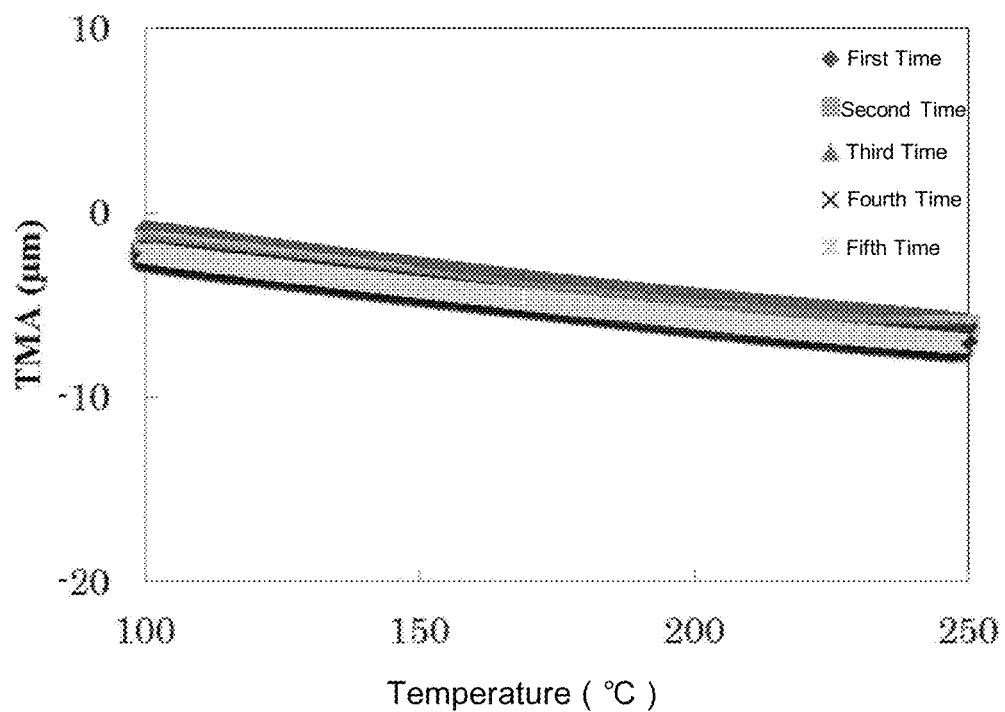
FIG. 7 is a graph showing measurement results of a thermal expansion coefficient of a sample of Example 1.
Figure 8:
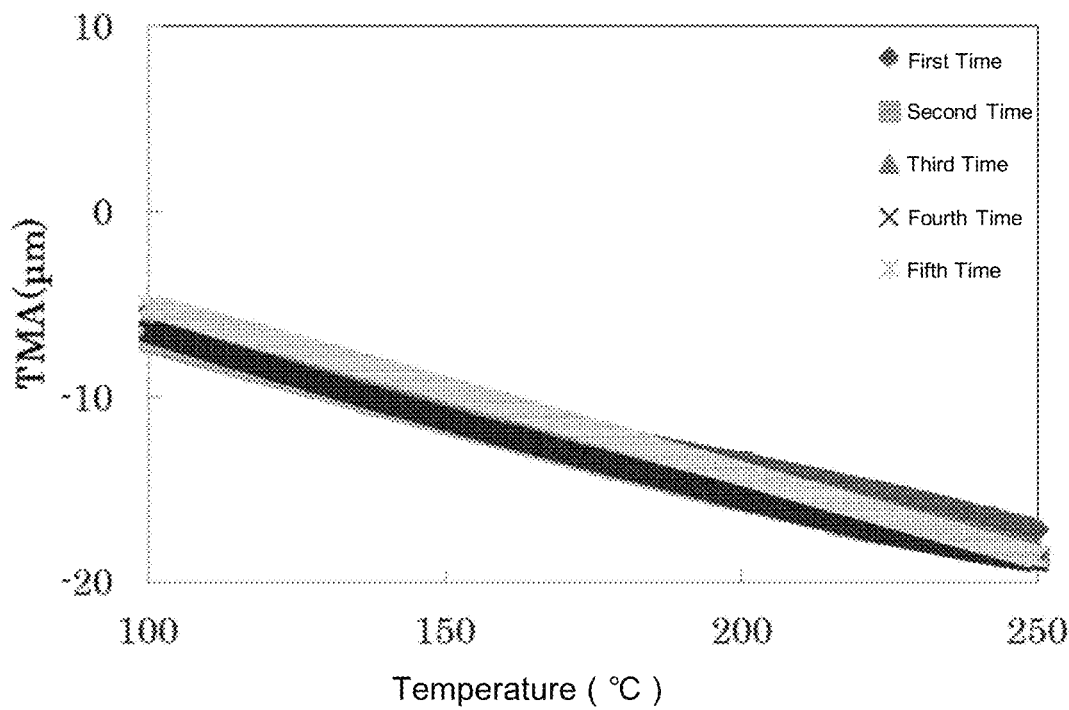
FIG. 8 is a graph showing measurement results of a thermal expansion coefficient of a sample of Comparative Example 1.
Figure 9:
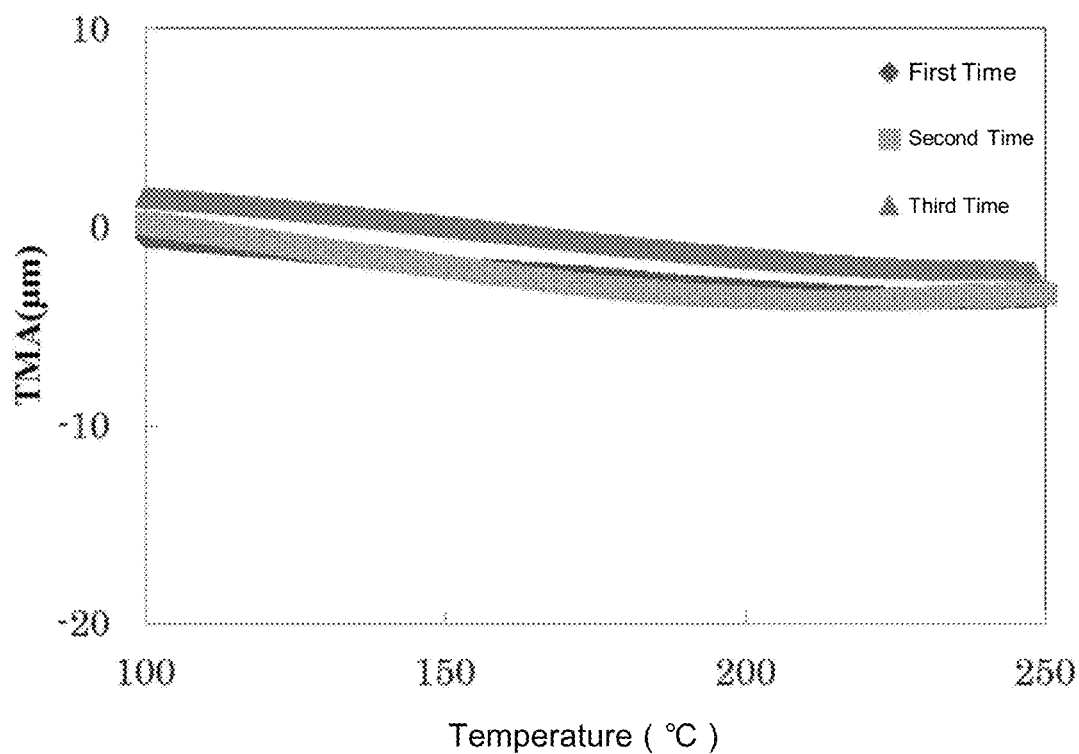
FIG. 9 is a graph showing measurement results of a thermal expansion coefficient of a sample of Example 2.
Figure 10:
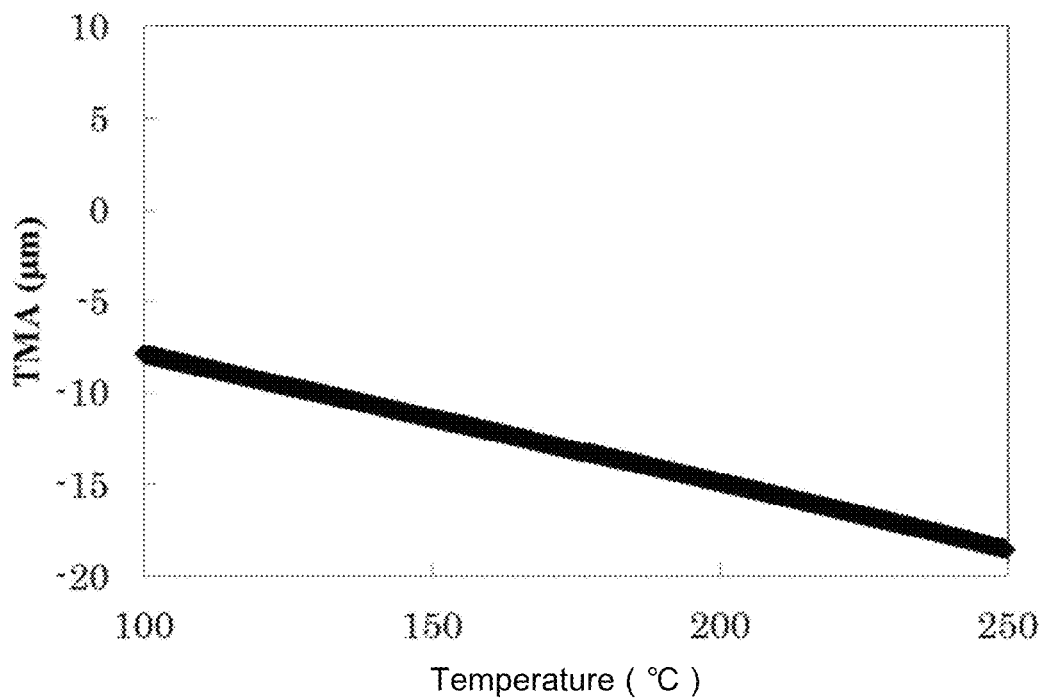
FIG. 10 is a graph showing measurement results of a thermal expansion coefficient of a sample of Example 3.

The $^1$H-NMR chart is shown in FIG. 6.

$^1$H-NMR (CDCl$_3$): 8.12 (d, 2H), 7.24-6.87 (m, 6H), 4.32 (d, 1H), 4.00 (d, 1H), 3.92 (m, 2H), 3.60 (s, 9H), 3.38 (m, 1H), 2.92 (m, 1H), 2.76 (m, 1H), 1.89 (m, 2H), 0.79 (m, 2H).

[Chem. 25]

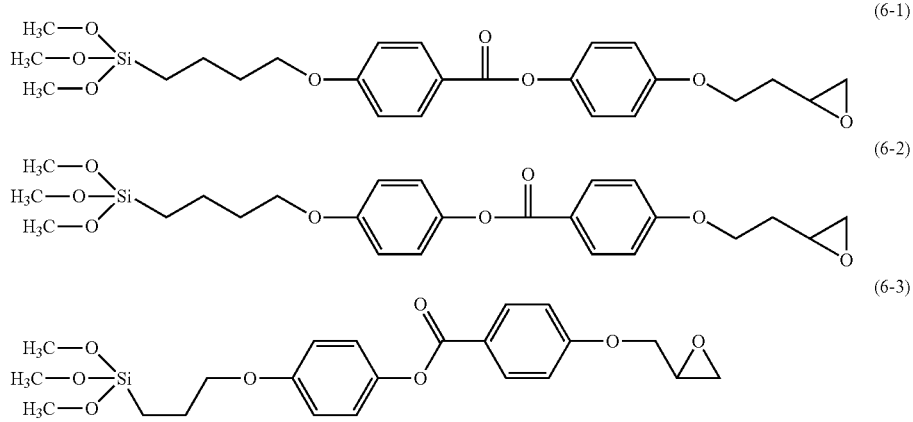

Other component materials constituting the heat-dissipating member used in the example of the present invention are as follows.

<Inorganic Fillers>
  Boron nitride: h-BN particles ((product name) Polar-Therm PTX-25 commercially available from Momentive Performance Materials Japan)

<Other Silane Coupling Agents>
  Silane coupling agent A: 3-aminopropyltrimethoxysilane ((product name) KBM-903 commercially available from Shin-Etsu Chemical Co., Ltd.)
  Silane coupling agent B: 3-glycidoxypropyltrimethoxysilane (S510 commercially available from JNC)
  Silane coupling agent C: 3-triethoxysilylpropylsuccinic anhydride (commercially available from Gelest)

[Chem. 26]

$$\text{C}_2\text{H}_5-\text{O}-\underset{\underset{\text{O}-\text{C}_2\text{H}_5}{|}}{\overset{\overset{\text{O}-\text{C}_2\text{H}_5}{|}}{\text{Si}}}-\text{CH}_2\text{CH}_2\text{CH}_2-\langle\text{succinic anhydride ring}\rangle$$

Preparation examples of the heat-dissipating member will be described below.

Example 1

Preparation of Liquid Crystal Silane Coupling Agent Treated Boron Nitride Particles 5.0 g of boron nitride particles (PTX25, hereinafter abbreviated as BN particles) and 1.05 g of the liquid crystal silane coupling agent (a mixture of (6-1) and (6-2)) as the first coupling agent were added to 50 mL of toluene (anhydrous), and the mixture was stirred at 750 rpm for 1 hour using a stirrer, and the obtained mixture was dried at 40° C. for 5 hours, and at room temperature for 19 hours. In addition, after the solvent was dried, a heat treatment was performed using a vacuum dryer set at 125° C. under vacuum conditions for 5 hours.

BN particles modified with the liquid crystal silane coupling agent were transferred into a sample tube, 50 mL of THF (commercially available from Nacalai Tesque Inc.) was added thereto, and pulverization was then performed using an ultrasonic treatment (MODEL450 commercially available from BRANSON). In addition, this solution was separated off and purified using a centrifuge (CT6E commercially available from Hitachi Koki Co., Ltd.) at 6,000 rpm for 10 minutes. After the supernatant solution was discarded, 50 mL of acetone was added thereto and the same operation was performed twice. The modified BN particles after purification were dried in an oven at 60° C. for 24 hours. The obtained particles were used as the first inorganic filler modified with a liquid crystal silane coupling agent.

Similarly, the same treatment was performed using 5.0 g of BN particles and 0.75 g of the silane coupling agent A (N-(2-aminoethyl)-3-aminopropyltrimethoxysilane) as the second coupling agent. The obtained particles were used as the second inorganic filler modified with the silane coupling agent A.

A coating amount of the first inorganic filler and the second inorganic filler with respect to BN particles of a liquid crystalline epoxy or silane coupling agent was calculated from a heating loss at 600° C. using a thermogravimeter/differential thermal measurement device (EXSTAR TG/DTA5200 commercially available from Seiko Instruments Inc. (currently Hitachi High-Technologies Corporation)).

Preparation of Composition for a Heat-Dissipating Member

The modified first inorganic filler and second inorganic filler were mixed together as follows.

0.564 g of the first inorganic filler and 0.166 g of the second inorganic filler were weighed out and mixed using an agate mortar, and then the mixture was mixed using two rollers at 55° C. for 10 minutes. Regarding the weight ratio, a ratio between the number of NH groups (since a reactive group of KBM903 was $NH_2$, the number of NH groups per molecule of a silane coupling agent was calculated as 2) of the second inorganic filler and the number of epoxy rings of the first inorganic filler was calculated as 1:1.

Preparation of Heat-Dissipating Member

Polymerization and molding were performed as follows.
The obtained mixture was inserted between stainless steel plates, pressing was performed to 9.8 MPa using a compression molding machine (F-37 commercially available from Shinto Metal Industry Co., Ltd.) set at 150° C., a heated state continued for 15 minutes, and thus an alignment treatment and pre-curing were performed. That is, when a mixture was spread between the stainless steel plates, since BN particles were plate-like particles, alignment was performed such that the particles and the stainless steel plates were parallel to each other. In addition, an amount of the sample was adjusted such that the thickness of the sample was about 200 µm. In addition, post-curing was performed at 80° C. for 1 hour, and at 180° C. for 3 hours using an oven, and a desired heat-dissipating member of the present invention was obtained. Here, in this state, a total amount of the liquid crystal silane coupling agent and the silane coupling agent A was about 13 volume %.

FIG. 2 shows a state in which the first inorganic filler 1, the second inorganic filler 2, a liquid crystal silane coupling agent as a first coupling agent 11, and the silane coupling agent A as a second coupling agent 12 were bonded together.

Evaluation of Thermal Conductivity and Thermal Diffusivity

Regarding the thermal conductivity, a specific heat (measured by a DSC type input compensation type differential scanning calorimeter EXSTAR 6000 commercially available from Seiko Instruments Inc. (currently Hitachi High-Technologies Corporation)) and a specific gravity (measured by a specific gravity meter AG204 density measurement kit commercially available from METTLER TOLEDO) of the heat-dissipating member were obtained in advance, the value was multiplied by a thermal diffusivity obtained by a TC7000 thermal diffusivity measurement device (commercially available from Advance Riko, Inc), and thereby the thermal conductivity was obtained. Here, the thermal diffusivity in the thickness direction was measured when a sample was subjected to a blackening treatment using a carbon spray and a standard sample holder was used. In addition, an adapter with a distance of 5 mm between a location at which a laser beam was emitted and a location at which infrared rays were detected was produced, and the thermal diffusivity in the planar direction was calculated from a time until infrared rays were emitted from when a laser beam was emitted to the sample, and a distance thereof.

Evaluation of Thermal Expansion Coefficient

A 5×20 mm test piece was cut out from the obtained sample, and a thermal expansion coefficient (measured by a TMA 7000 type thermomechanical analyzer commercially available from (currently) Hitachi High-Technologies Corporation) was obtained in a range of room temperature to 250° C. A temperature range was appropriately adjusted according to a heat resistance of the sample to be measured.

Comparative Example 1

2 g and 4 g of the second inorganic filler modified with the silane coupling agent A and the polymerizable liquid crystal compound (5-4) having an epoxy group at both ends were weighed out (content of BN particles was 19 volume %), respectively, on pharmaceutical paper, and mixed using a mortar, and kneading was then performed using two rollers (HR-3 commercially available from Nitto reactor) at 120° C. for 10 minutes. Then, separation and purification were performed through an ultrasonic treatment and centrifugation, and BN particles modified with the polymerizable liquid crystal compound from which unreacted components were removed were obtained. The particles were used as a first comparative filler. In this case, regarding the amount of the polymerizable liquid crystal compound, an amount that is an amount of about five times a molar amount of the polymerizable liquid crystal compound to be reacted with the silane coupling agent A (as described above, computed when two epoxy groups reacted per molecule of a silane coupling agent with the terminal $NH_2$) covering the second inorganic filler was used. The amount of the polymerizable liquid crystal compound was in excess in this manner in order to prevent epoxy groups at both ends of the polymerizable liquid crystal compound from being bonded to a different second inorganic filler and being cured when the first comparative filler was synthesized.

A sample was produced in the same manner as in Example 1 using the first comparative filler and the second inorganic filler modified with the silane coupling agent A, and the thermal conductivity and a thermal expansion coefficient were measured.

Figure 3:
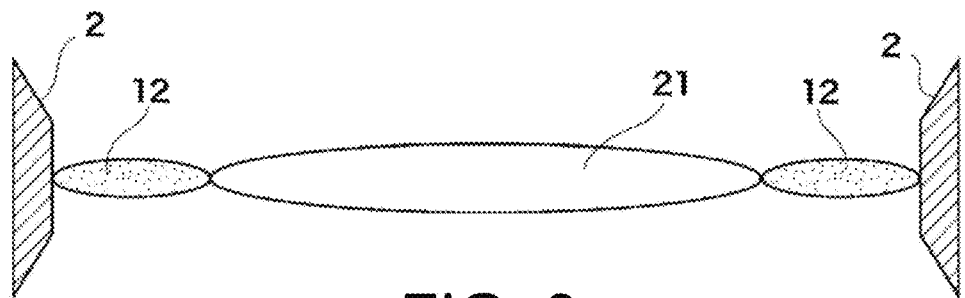
FIG. 3 is a conceptual diagram showing a state in which, when a composition for a heat-dissipating member is cured, the other ends of the coupling agent 12 bonded to the second inorganic filler 2 are bonded to each other with a polymerizable liquid crystal compound $^+$21 therebetween.

FIG. 3 shows a state in which the second inorganic filler 2, the silane coupling agent A as the second coupling agent 12, and a polymerizable liquid crystal compound 21 were bonded together.

Example 2

A sample of Example 2 was obtained in the same manner as in Example 1 except that a commercial silane coupling agent B was used in place of the liquid crystal silane coupling agent in Example 1.

Figure 4:
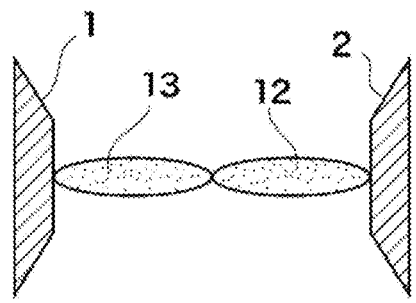
FIG. 4 is a conceptual diagram showing a state in which, when a composition for a heat-dissipating member is cured, the other end of a coupling agent 13 bonded to the first inorganic filler 1 is bonded to the other end of the coupling agent 12 bonded to the second inorganic filler 2.

FIG. 4 shows a state in which the first inorganic filler 1, the second inorganic filler 2, the silane coupling agent B as a first coupling agent 13, and the silane coupling agent A as a second coupling agent 12 were bonded together.

Example 3

A sample of Example 3 was obtained in the same manner as in Example 1 except that a commercial silane coupling agent C was used in place of the liquid crystal silane coupling agent in Example 1.

FIG. 4 shows a state in which the first inorganic filler 1, the second inorganic filler 2, the silane coupling agent C as the first coupling agent 13, and the silane coupling agent A as a second coupling agent 12 were bonded together.

Example 4

A sample of Example 4 was obtained in the same manner as in Example 1 except that the liquid crystal silane coupling agent (6-3) was used in place of the liquid crystal silane coupling agents (the mixture of (6-1) and (6-2)) in Example 1.

FIG. 2 shows a state in which the first inorganic filler 1, the second inorganic filler 2, a liquid crystal silane coupling agent as a first coupling agent 11, and the silane coupling agent A as a second coupling agent 12 were bonded together.

Measurement results of the thermal expansion coefficient of Examples 1 to 4, and Comparative Example 1 are shown in FIG. 7 to 11.

Based on the measurement results of the thermal expansion coefficient, it can be understood that, as in Comparative Example 1, also in Example 1, a sample with a negative thermal expansion coefficient and high heat resistance (no glass transition point was observed to 250° C.) was produced. Compared to Example 1, in the method of Comparative Example 1, it was necessary to perform processes of mixing in the polymerizable liquid crystal compound (5-4) of which there was about 10 times as much as the silane coupling agent and washing out the excess polymerizable liquid crystal compound (5-4) after reaction. Therefore, in the method of Example 1, it was possible to save raw materials, and reduce the number of production processes. In addition, it was found that Example 1 had higher reproducibility of a temperature cycle than Comparative Example 1. This is thought to be due to a small amount of the unreacted polymerization component, and it was found that the method of the present invention was simpler than the method of Comparative Example 1, and it was possible to form a sheet having a negative thermal expansion coefficient, high heat resistance, and high thermal conductivity by the method of the present invention.

On the other hand, compared to Example 2 in which a coupling agent having an epoxy group was used, in Example 1, it was found that, when an organic chain of the coupling agent was made liquid crystalline, a relationship between the temperature and contraction of the sample was linear, and reproducibility when a thermal cycle was repeated was high. This is thought to have been caused by the fact that thermal stability of a part to which BN particles were bonded was improved according to liquid crystallization. However, it is thought that, since the liquid crystal was formed, heat resistance was not increased, and a molecular structure with favorable heat resistance and high phonon conductivity had a linear structure with multiple rings, and as a result, liquid crystallinity was often exhibited.

In Example 3, a coupling agent having succinic anhydride at a reaction part was used in place of the commercial coupling agent having an epoxy group in Example 2. Since succinic anhydride of the commercial coupling agent C and a diamine of the commercial coupling agent A were reacted and thus inorganic fillers were bonded to each other by imide bonds and some amide bonds, compared to a case in which an epoxy group and a diamine were bonded, the measurement results of the thermal expansion coefficient were linear. This shows that the imide bond had higher heat resistance, and even in the liquid crystal coupling agent as in Example 1, when a bond with favorable heat resistance was additionally used, the heat resistance was improved.

Figure 11:
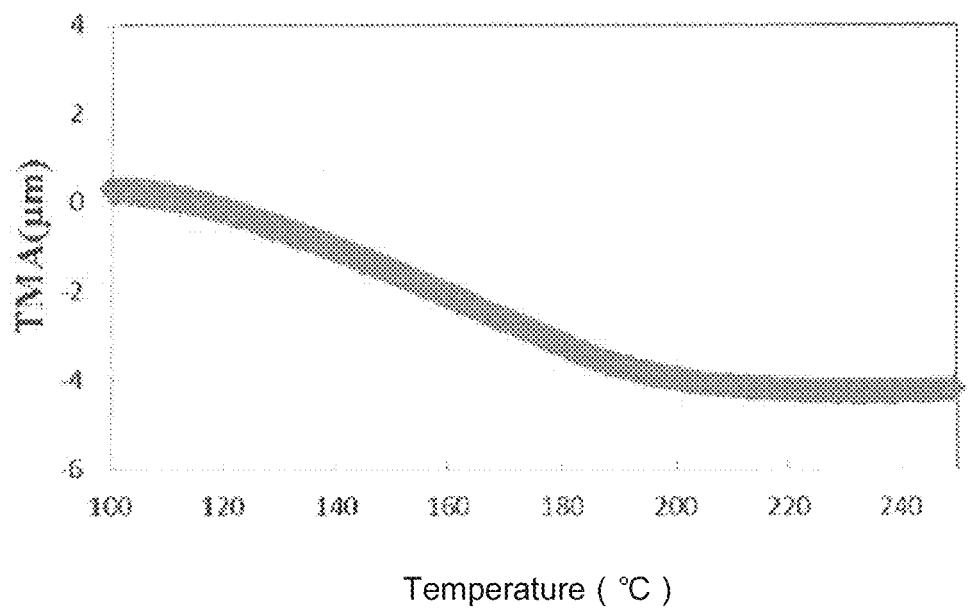
FIG. 11 is a graph showing measurement results of a thermal expansion coefficient of a sample of Example 4.

In Example 4, the coupling agent of (6-3) was used in place of the liquid crystal silane coupling agent of Example 1. In this structure, the thermal conductivity was slightly lower, and a negative thermal expansion coefficient was maintained, but an inflection point of the thermal expansion coefficient was found at 190° C. (FIG. 11). Therefore, it can be understood that the structure of Example 1 was excellent in applications used at high temperatures. The structure of a liquid crystal part is required to be determined based on the required heat resistance.

Measurement results of the thermal conductivity of Examples 1 to 4, and Comparative Example 1 are shown in Table 1.

[Table 1]

TABLE 1

Thermal conductivity of BN composite materials

| | Actual composition (weight ratio of BN:polymerizable compound) | Thermal conductivity in x-y direction (W/mK) | Thermal conductivity in thickness direction (W/mK) |
|---|---|---|---|
| Example 1 | 87:13 | 57.3 | 9.6 |
| Example 2 | 90:10 | 57.1 | 7.7 |
| Example 3 | 89:11 | 58.0 | 7.3 |
| Example 4 | 91:9 | 49.2 | 8.3 |
| Comparative Example 1 | 85:15 | 55.4 | 11.4 |

Comparing Example 1 and Comparative Example 1, a proportion of the liquid crystal silane coupling agent and the polymerizable compound with respect to BN particles was smaller in Example 1 than Comparative Example 1. This is thought to have been caused by the fact that, while one epoxy type liquid crystal part was bonded to one coupling agent part in the liquid crystal silane coupling agents (6-1) and (6-2) of Example 1, since the terminal reactive group of the silane coupling agent A used in Comparative Example 1 was in the state of $NH_2$, at this part, the polymerizable liquid crystal compound (5-4) reacted with two molecules and epoxy molecules that did not contribute to binding BN and BN were present. In addition, thermal conductivity in the x-y direction was slightly higher in Example 1 than Comparative Example 1. This is thought to have been caused by the fact that thermal conductivity was higher because BN and BN were efficiently bonded. On the other hand, the thermal conductivity in the thickness direction was slightly lower in Example 1. This is thought to have been caused by the fact that, when plate-like BN particles were stacked, excess liquid crystalline epoxy can bind upper and lower BN particles in Comparative Example 1. Comparing Example 1 and Example 2, it is thought that, since the thermal conductivity of originally highly aligned polyethylene was very high, thermal conductivity of the methylene structure was expected to be favorable, and the chain length of the coupling agent B was also short, phonon conduction was fast and as a result, thermal conductivity was improved. In addition, comparing Example 2 and Example 3, the length of the methylene structure was equal, and there was almost no difference in thermal conductivity between epoxy-amine bonds and between imide bonds. Therefore, the length and the reactive group of the coupling agent may be designed in consideration of a balance between desired thermal conductivity and heat resistance.

Figure 12:
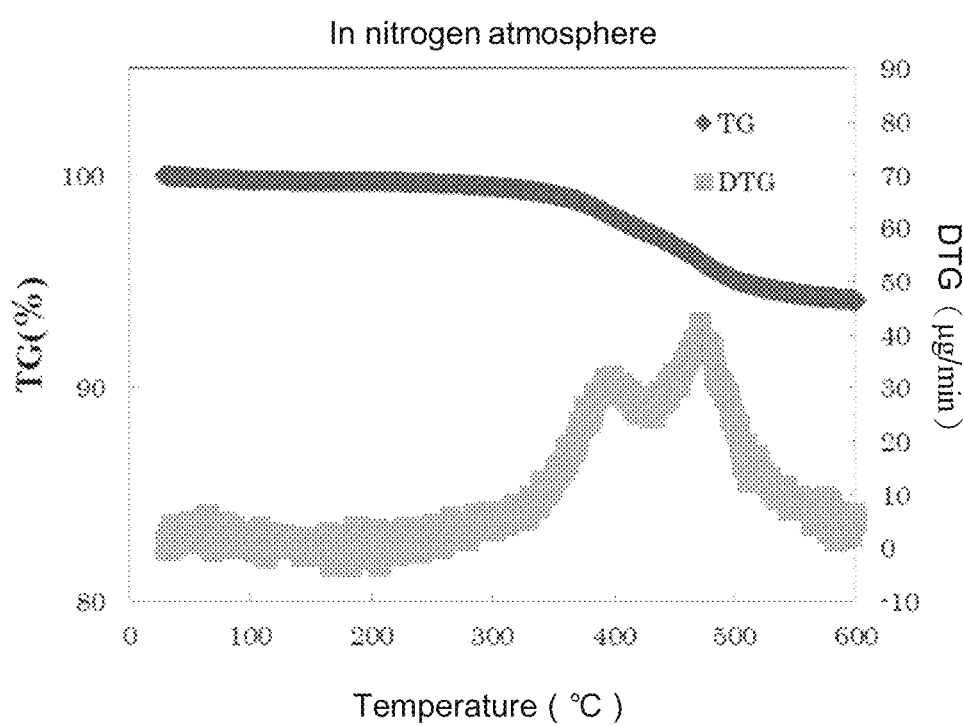
FIG. 12 is a graph of TG/DTG in a nitrogen atmosphere.
Figure 13:
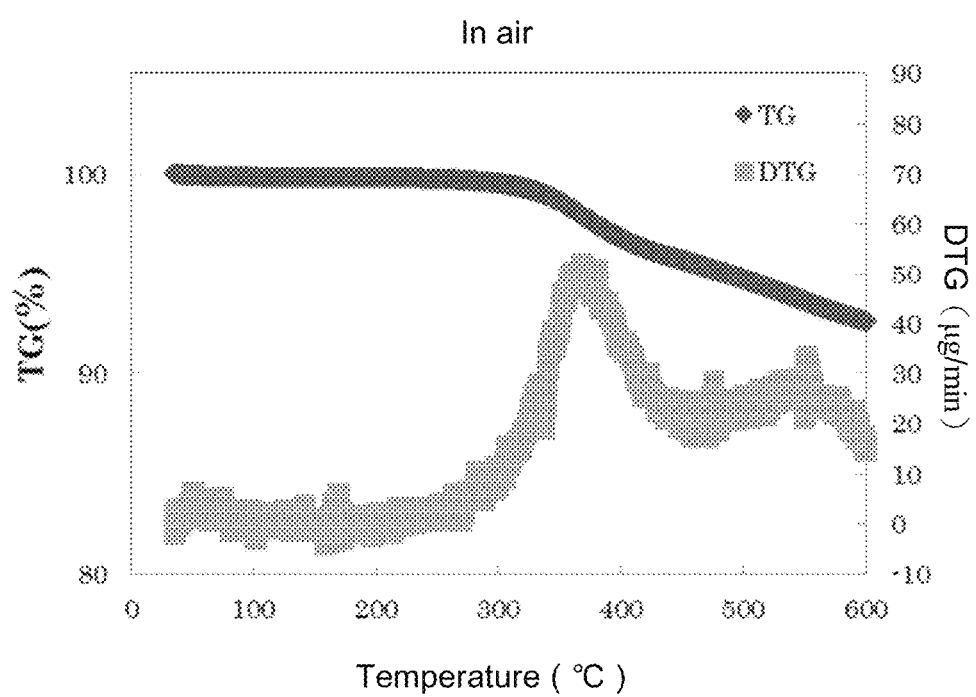
FIG. 13 is a graph of TG/DTG in air.

Thermogravimeter/differential thermal analysis was performed on the sample produced in Example 1. FIG. 12 shows results in a nitrogen atmosphere, and FIG. 13 shows results in air.

Based on the measurement results, it can be understood that composite materials of the present invention had heat resistance at 320° C. under a nitrogen atmosphere, and at about 280° C. in air. In view of these results, it can be understood that the composite materials of the present invention can alleviate physical stress due to thermal expansion and are materials with high heat resistance, and additionally can be used as materials with high thermal conductivity.

All references including publications, patent applications, and patents cited in this specification are referred to and incorporated herein to the same extent as if the references were individually exemplified, referred to and incorporated, and all details thereof are described herein.

The use of nouns and corresponding demonstratives in the context of describing the present invention (especially in the context of the following claims) is to be construed to cover both the singular and the plural unless otherwise specified herein or otherwise clearly contradicted by context. The terms "comprise," "include," "contain," and "have" are interpreted as open-ended terms (that is, to mean "includes, but is not limited to") unless otherwise noted. Unless otherwise specified in this specification, the numerical ranges of objects in this specification are merely intended to serve as abbreviations for individually indicating values falling within the ranges, and the values are incorporated in this specification as if they were individually recited herein. All methods described herein can be performed in any appropriate order unless otherwise described herein or otherwise clearly contradicted by context. Unless otherwise claimed, any example or exemplary phrase (for example, "such as") used herein is intended merely to better describe the present invention and is not intended to limit the scope of the present invention. Terms in this specification should not be construed to indicate elements that are essential for the implementation of the present invention but are not described in the claims.

This specification includes the best means for implementing the present invention known to the inventors and preferable embodiments of the present invention have been described. Those skilled in the art will clearly understand modifications of such preferable embodiments that may be made upon reading the above description. The inventors expect such skilled people to appropriately apply such modifications and assume that the present invention will be implemented using methods other than those specifically described herein. Accordingly, the present invention includes all modifications and equivalents of content described in the claims appended to this specification as allowed by applicable law. Moreover, the present invention encompasses any combination of the above elements in all of the modifications unless otherwise described herein or clearly contradicted by the context.

The invention claimed is:

1. A composition for a heat-dissipating member comprising:
   a thermally conductive first inorganic filler that is bonded to one end of a first coupling agent; and
   a thermally conductive second inorganic filler that is bonded to one end of a second coupling agent,
   wherein at least one of the first coupling agent and the second coupling agent is a liquid crystal silane coupling agent, and
   the other end of the first coupling agent and the other end of the second coupling agent have functional groups capable of bonding to each other through curing treatment.

2. The composition for a heat-dissipating member according to claim 1,
   wherein the first inorganic filler and the second inorganic filler are at least one selected from the group consisting of boron nitride, boron carbide, boron carbonitride, graphite, carbon fibers, carbon nanotubes, graphene, alumina, silica, aluminum nitride, silicon carbide, zinc oxide, magnesium hydroxide, and iron oxide-based material.

3. The composition for a heat-dissipating member according to claim 1, further comprising
   a third inorganic filler having a different thermal expansion coefficient from those of the first inorganic filler and the second inorganic filler.

4. The composition for a heat-dissipating member according to claim 1, further comprising
   an organic compound or a polymer compound that is not bonded to the first inorganic filler and the second inorganic filler.

5. The composition for a heat-dissipating member according to claim 1,
   wherein the liquid crystal silane coupling agent is a silane coupling agent represented by the following Formula (1),

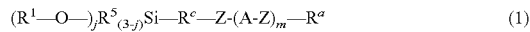

in Formula (1),
$R^a$ is a polymerizable group not containing a —C=C— or —C≡C— moiety;

$R^c$ is a group having 2 to 3 carbon atoms selected from the group consisting of —CH$_2$CH$_2$—, —CH$_2$CH$_2$CH$_2$—, —CH(CH$_3$)CH$_2$—, —CH$_2$CH(CH$_3$)—, —CH$_2$CH$_2$C(=O)—, —CH$_2$CH$_2$C(=O)O—, —CH$_2$CH(X)—, —CH$_2$CH(CX$_3$)—, —CH$_2$CH(X)CH$_2$—, CH$_2$CH(CX$_3$)CH$_2$—, —CH$_2$CH(X)C(=O)—, —CH$_2$CH(CX$_3$)C(=O)—, —CH$_2$CH(X)C(=O)O—, and —CH$_2$CH(CX$_3$)C(=O)O—, where X is a halogen atom;

A is 1,4-cyclohexylene, 1,4-cyclohexenylene, 1,4-phenylene, naphthalene-2,6-diyl, fluorene-2,7-diyl or a divalent group represented by the following Formulae (3-1) to (3-7), and in Formulae (3-1) to (3-7), * indicates an asymmetric carbon atom, in these rings represented by A, any —CH$_2$— is optionally substituted with —O—, any —CH= is optionally substituted with —N=, and any hydrogen atom is optionally substituted with a halogen atom, an alkyl group having 1 to 10 carbon atoms, an alkyl halide having 1 to 10 carbon atoms, or a group in which any —CH$_2$— is substituted with —O—, —CO—, —COO—, —OCO—, —CH=CH— or —C≡C— in the alkyl group or the alkyl halide;

Z independently represents a single bond, an alkylene group having 1 to 20 carbon atoms in which any hydrogen atom is optionally substituted with a halogen atom, or a group in which any —CH$_2$— is substituted with —O—, —CO—, —COO— or —OCO— in the alkylene group;

m is an integer of 1 to 6;

$R^5$ is a hydrogen atom or an alkyl group having 1 to 8 carbon atoms;

$R^1$ is a hydrogen atom or an alkyl group having 1 to 5 carbon atoms;

j is an integer of 1 to 3;

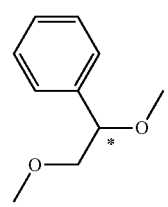

(3-1)

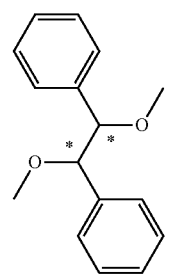

(3-2)

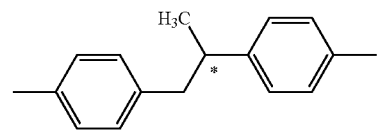

(3-3)

-continued

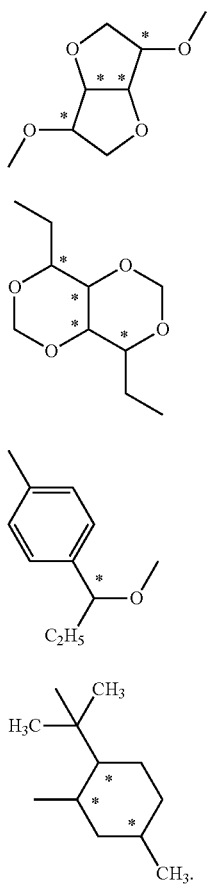

(3-4)

(3-5)

(3-6)

(3-7)

6. The composition for a heat-dissipating member according to claim 5,
wherein the liquid crystal silane coupling agent of Formula (1) is a silane coupling agent represented by the following Formula (1-1) or (1-2),

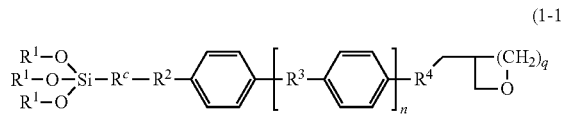

(1-1)

in Formula (1-1), $R^c$ is —$CH_2$—$CH_2$—, —$CH_2$—$CH_2$—$CH_2$—, —$CH_2$—$CH_2$—CO—, —$CH_2$—$CH_2$—CO—O—, —$CH_2$—CHF—CO—O—, or —$CH_2$—$CCF_3$—CO—O—, $R^1$ is a methyl or ethyl group, $R^2$, $R^3$ and $R^4$ independently represent a single bond, —$(CH_2)_a$—, —O—, —$O(CH_2)_a$—, —$(CH_2)_aO$—, —$O(CH_2)_aO$—, —COO—, —OCO—, —$CH_2CH_2$—COO—, or —OCO—$CH_2CH_2$—, and a is an integer of 1 to 6, n is an integer of 1 to 6, q is 0 or 1;

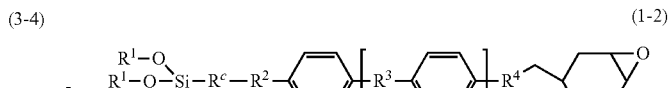

(1-2)

$R^c$ is —$CH_2$—$CH_2$—, —$CH_2$—$CH_2$—$CH_2$—, —$CH_2$—$CH_2$—CO—, —$CH_2$—$CH_2$—CO—O—, —$CH_2$—CHF—CO—O—, or —$CH_2$—$CCF_3$—CO—O—, $R^1$ is a methyl or ethyl group, $R^2$ is a single bond, —$(CH_2)_a$—, —O—, —$O(CH_2)_a$—, —$(CH_2)$—O—, —$O(CH_2)_aO$—, —COO—, —OCO—, —$CH_2CH_2$—COO—, or —OCO—$CH_2CH_2$—, and a is an integer of 1 to 6, $R^3$ and $R^4$ independently represent a single bond, —$(CH_2)_a$—, —O—, $O(CH_2)_a$—, —$(CH_2)_aO$—, —$O(CH_2)$—O—, —COO—, —OCO—, —$CH_2CH_2$—COO—, or —OCO—$CH_2CH_2$—, and a is an integer of 1 to 6, n is an integer of 1 to 6.

7. A heat-dissipating member obtained by curing the composition for a heat-dissipating member according to claim 1.

8. An electronic instrument comprising:
the heat-dissipating member according to claim 7; and
an electronic device including a heating unit,
wherein the heat-dissipating member is disposed on the electronic device such that it comes in contact with the heating unit.

9. A method for producing a composition for a heat-dissipating member comprising:
a process of bonding a thermally conductive first inorganic filler to one end of a first coupling agent; and
a process of bonding a thermally conductive second inorganic filler to one end of a second coupling agent,
wherein at least one of the first coupling agent and the second coupling agent is a liquid crystal silane coupling agent, and
the other end of the first coupling agent and the other end of the second coupling agent have functional groups capable of bonding to each other.

10. A method for producing a heat-dissipating member comprising:
producing a composition for a heat-dissipating member according to the method of claim 9; and
bonding the other end of the first coupling agent to the other end of the second coupling agent.

11. The composition for a heat-dissipating member according to claim 2, further comprising
a third inorganic filler having a different thermal expansion coefficient from those of the first inorganic filler and the second inorganic filler.

12. The composition for a heat-dissipating member according to claim 2, further comprising
an organic compound or a polymer compound that is not bonded to the first inorganic filler and the second inorganic filler.

13. The composition for a heat-dissipating member according to claim 3, further comprising
an organic compound or a polymer compound that is not bonded to the first inorganic filler and the second inorganic filler.

14. The composition for a heat-dissipating member according to claim 2, wherein the liquid crystal silane coupling agent is a silane coupling agent represented by the following Formula (1), $$(R^1\text{—O—})_j R^5{}_{(3-j)}\text{Si—}R^c\text{—Z-(A-Z)}_m\text{—}R^a \quad (1)$$

in Formula (1), $R^a$ is a polymerizable group not containing a —C=C— or —C≡C— moiety;

$R^c$ is a group having 2 to 3 carbon atoms selected from the group consisting of —CH$_2$CH$_2$—, —CH$_2$CH$_2$CH$_2$—, —CH(CH$_3$)CH$_2$—, —CH$_2$CH(CH$_3$)—, —CH$_2$CH$_2$C(=O)—, —CH$_2$CH$_2$C(=O)O—, —CH$_2$CH(X)—, —CH$_2$CH(CX$_3$)—, —CH$_2$CH(X)CH$_2$—, —CH$_2$CH(CX$_3$)CH$_2$—, —CH$_2$CH(X)C(=O)—, —CH$_2$CH(CX$_3$)C(=O)—, —CH$_2$CH(X)C(=O)O—, and —CH$_2$CH(CX$_3$)C(=O)O—, where X is a halogen atom;

A is 1,4-cyclohexylene, 1,4-cyclohexenylene, 1,4-phenylene, naphthalene-2,6-diyl, fluorene-2,7-diyl or a divalent group represented by the following Formulae (3-1) to (3-7), and in Formulae (3-1) to (3-7), * indicates an asymmetric carbon atom, in these rings represented by A, any —CH$_2$— is optionally substituted with —O—, any —CH= is optionally substituted with —N=, and any hydrogen atom is optionally substituted with a halogen atom, an alkyl group having 1 to 10 carbon atoms, an alkyl halide having 1 to 10 carbon atoms, or a group in which any —CH$_2$— is substituted with —O—, —CO—, —COO—, —OCO—, —CH=CH— or —C≡C— in the alkyl group or the alkyl halide;

Z independently represents a single bond, an alkylene group having 1 to 20 carbon atoms in which any hydrogen atom is optionally substituted with a halogen atom, or a group in which any —CH$_2$— is substituted with —O—, —CO—, —COO— or —OCO— in the alkylene group;

m is an integer of 1 to 6;

$R^5$ is a hydrogen atom or an alkyl group having 1 to 8 carbon atoms;

$R^1$ is a hydrogen atom or an alkyl group having 1 to 5 carbon atoms;

j is an integer of 1 to 3;

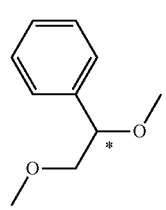

(3-1)

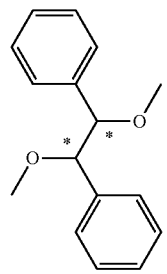

(3-2)

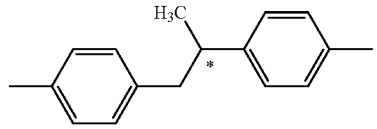

(3-3)

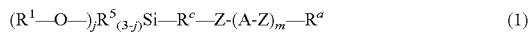

(3-4)

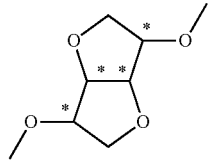

(3-5)

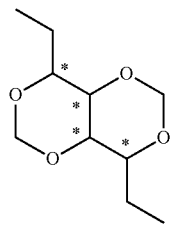

(3-6)

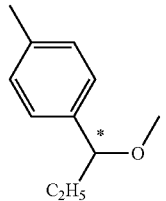

(3-7)

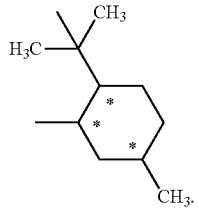

15. The composition for a heat-dissipating member according to claim 3, wherein the liquid crystal silane coupling agent is a silane coupling agent represented by the following Formula (1), $$(R^1\text{—O—})_j R^5{}_{(3-j)}\text{Si—}R^c\text{—Z-(A-Z)}_m\text{—}R^a \quad (1)$$

in Formula (1), $R^a$ is a polymerizable group not containing a —C=C— or —C≡C— moiety;

$R^c$ is a group having 2 to 3 carbon atoms selected from the group consisting of —CH$_2$CH$_2$—, —CH$_2$CH$_2$CH$_2$—, —CH(CH$_3$)CH$_2$—, —CH$_2$CH(CH$_3$)—, —CH$_2$CH$_2$C(=O)—, —CH$_2$CH$_2$C(=O)O—, —CH$_2$CH(X)—, —CH$_2$CH(CX$_3$)—, —CH$_2$CH(X)CH$_2$—, —CH$_2$CH(CX$_3$)CH$_2$—, —CH$_2$CH(X)C(=O)—, —CH$_2$CH(CX$_3$)C(=O)—, —CH$_2$CH(X)C(=O)O—, and —CH$_2$CH(CX$_3$)C(=O)O—, where X is a halogen atom;

A is 1,4-cyclohexylene, 1,4-cyclohexenylene, 1,4-phenylene, naphthalene-2,6-diyl, fluorene-2,7-diyl or a divalent group represented by the following Formulae (3-1) to (3-7), and in Formulae (3-1) to (3-7), * indicates an asymmetric carbon atom, in these rings represented by A, any —CH$_2$— is optionally substituted with —O—, any —CH= is optionally substituted with —N=, and any hydrogen atom is optionally substituted with a halogen atom, an alkyl group having 1 to 10 carbon atoms, an alkyl halide having 1 to 10 carbon atoms, or a group in which any —CH$_2$— is substituted with —O—, —CO—, —COO—, —OCO—, —CH=CH— or —C≡C— in the alkyl group or the alkyl halide;

Z independently represents a single bond, an alkylene group having 1 to 20 carbon atoms in which any hydrogen atom is optionally substituted with a halogen atom, or a group in which any —CH$_2$— is substituted with —O—, —CO—, —COO— or —OCO— in the alkylene group;

m is an integer of 1 to 6;

R$^5$ is a hydrogen atom or an alkyl group having 1 to 8 carbon atoms;

R$^1$ is a hydrogen atom or an alkyl group having 1 to 5 carbon atoms;

j is an integer of 1 to 3;

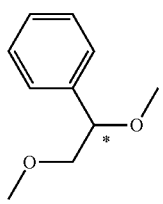
(3-1)

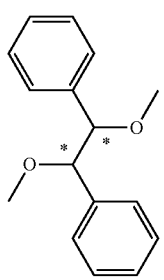
(3-2)

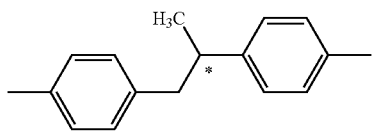
(3-3)

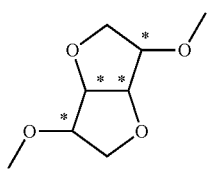
(3-4)

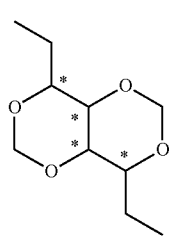
(3-5)

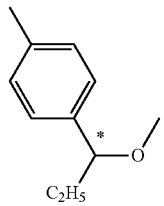
(3-6)

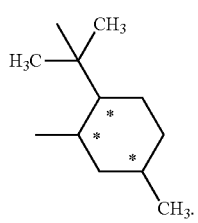
(3-7)

16. The composition for a heat-dissipating member according to claim 4, wherein the liquid crystal silane coupling agent is a silane coupling agent represented by the following Formula (1), $$(R^1-O-)_j R^5_{(3-j)}Si-R^c-Z-(A-Z)_m-R^a \qquad (1)$$

in Formula (1),

R$^a$ is a polymerizable group not containing a —C=C— or —C≡C— moiety;

R$^c$ is a group having 2 to 3 carbon atoms selected from the group consisting of —CH$_2$CH$_2$—, —CH$_2$CH$_2$CH$_2$—, —CH(CH$_3$)CH$_2$—, —CH$_2$CH(CH$_3$)—, —CH$_2$CH$_2$C(=O)—, —CH$_2$CH$_2$C(=O)O—, —CH$_2$CH(X)—, —CH$_2$CH(CX$_3$)—, —CH$_2$CH(X)CH$_2$—, CH$_2$CH(CX$_3$)CH$_2$—, —CH$_2$CH(X)C(=O)—, —CH$_2$CH(CX$_3$)C(=O)—, —CH$_2$CH(X)C(=O)O—, and —CH$_2$CH(CX$_3$)C(=O)O—, where X is a halogen atom;

A is 1,4-cyclohexylene, 1,4-cyclohexenylene, 1,4-phenylene, naphthalene-2,6-diyl, fluorene-2,7-diyl or a divalent group represented by the following Formulae (3-1) to (3-7), and in Formulae (3-1) to (3-7), * indicates an asymmetric carbon atom, in these rings represented by A, any —CH$_2$— is optionally substituted with —O—, any —CH= is optionally substituted with and any hydrogen atom is optionally substituted with a halogen atom, an alkyl group having 1 to 10 carbon atoms, an alkyl halide having 1 to 10 carbon atoms, or a group in which any —CH$_2$— is substituted with —O—, —CO—, —COO—, —OCO—, —CH=CH— or —C≡C— in the alkyl group or the alkyl halide;

Z independently represents a single bond, an alkylene group having 1 to 20 carbon atoms in which any hydrogen atom is optionally substituted with a halogen atom, or a group in which any —CH$_2$— is substituted with —O—, —CO—, —COO— or —OCO— in the alkylene group;

m is an integer of 1 to 6;

R⁵ is a hydrogen atom or an alkyl group having 1 to 8 carbon atoms;

R¹ is a hydrogen atom or an alkyl group having 1 to 5 carbon atoms;

j is an integer of 1 to 3;

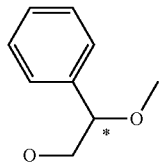
(3-1)

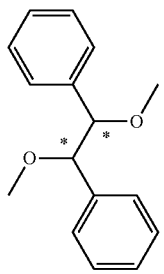
(3-2)

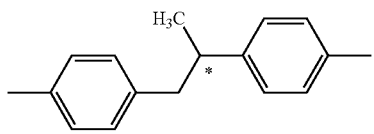
(3-3)

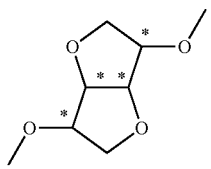
(3-4)

-continued

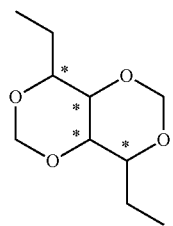
(3-5)

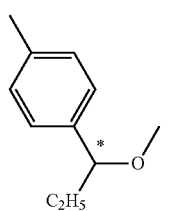
(3-6)

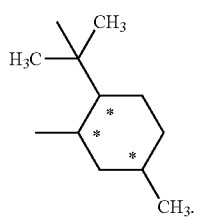
(3-7)

17. A heat-dissipating member obtained by curing the composition for a heat-dissipating member according to claim 2.

18. A heat-dissipating member obtained by curing the composition for a heat-dissipating member according to claim 3.

19. A heat-dissipating member obtained by curing the composition for a heat-dissipating member according to claim 4.

20. A heat-dissipating member obtained by curing the composition for a heat-dissipating member according to claim 5.

* * * * *